(12) United States Patent
Kato

(10) Patent No.: US 6,294,952 B1
(45) Date of Patent: Sep. 25, 2001

(54) QUADRATURE DEMODULATOR QUADRATURE DEMODULATION METHOD AND RECORDING MEDIUM

(75) Inventor: Takashi Kato, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/577,111

(22) Filed: May 23, 2000

(30) Foreign Application Priority Data

| May 24, 1999 | (JP) | 11-143512 |
| Mar. 14, 2000 | (JP) | 12-069703 |
| Apr. 14, 2000 | (JP) | 12-113409 |

(51) Int. Cl.$^7$ ................................................. H04L 27/38
(52) U.S. Cl. .......................... 329/306; 329/308; 375/324
(58) Field of Search .................................. 329/304, 305, 329/306, 307, 308, 309, 310; 375/324, 325, 326, 327, 328

(56) References Cited

U.S. PATENT DOCUMENTS

| 4,003,054 | * | 1/1977 | Goldstone | 342/174 |
| 4,736,390 | * | 4/1988 | Ward et al. | 375/316 |
| 5,896,061 | * | 4/1999 | Behrent | 329/308 |

* cited by examiner

*Primary Examiner*—Siegfried H. Grimm
(74) *Attorney, Agent, or Firm*—Lowe Hauptman Gilman & Berner, LLP

(57) ABSTRACT

A quadrature demodulator capable of calibrating an I (Q) signal conversion section without stopping the receiving operation performed by the quadrature demodulator. The quadrature demodulator comprises: an adder 32 for generating a pseudo noise superimposed signal obtained by adding a user signal IF and a pseudo noise PN; a signal conversion section 100 for generating a converted signal obtained by mixing the pseudo noise superimposed signal with a local frequency signal L1 of a predetermined local frequency; a first multiplier 72 for generating a correlated signal obtained by multiplying the converted signal with the pseudo noise, a first integrator 82 for integrating the correlated signal to provide an output; and a succeeding circuit 90 for processing the converted signal in a desired way. While performing calibration by causing the first multiplier 72 to extract the pseudo noise, the quadrature demodulator allows the succeeding circuit 90 to process the converted signal in a desired way. Therefore, the quadrature demodulator can calibrate the signal conversion section 100 without stopping its own receiving operation.

39 Claims, 26 Drawing Sheets

$$i(t) = mI(t)\cos(\psi + \theta) + mQ(t)\sin(\psi + \theta) + maP(t)\cos\theta + d \quad (1)$$

$$i(t) \cdot P(t) = P(t)(mI(t)\cos(\psi + \theta) + mQ(t)\sin(\psi + \theta) + d) + maP^2(t)\cos\theta \quad (2)$$

$$\int_0^t i(t) \cdot P(t)dt = mag\cos\theta \quad (3)$$

$$r(t) = I(t)\cos\psi + Q(t)\sin\psi + aP(t) \quad (4)$$

$$\int_0^t r(t) \cdot P(t)dt = ag \quad (5)$$

$$m = mag / ag \quad (6)$$

$$i(t) = I(t)\cos\psi + Q(t)\sin\psi + aP(t) + d \quad (7)$$

FIG. 5

$$mI(t)\cos(\psi+\theta) + mQ(t)\sin(\psi+\theta) + d \qquad (1')$$

FIG. 15

$$\text{Ich} : \int P(t)\cos(\omega t + \theta)\cos\omega t\, dt \tag{8}$$

$$\text{Qch} : \int P(t)\cos(\omega t + \theta)\sin\omega t\, dt \tag{9}$$

$$\text{Ich} : \int P(t)\cos^2\omega t\, dt \tag{10}$$

$$\text{Qch} : \int P(t)\cos\omega t \sin\omega t\, dt = \frac{1}{2}\int P(t)\sin 2\omega t\, dt \tag{11}$$

$$\text{Ich} : \int P(t)(-\sin\omega t)\cos\omega t\, dt = -\frac{1}{2}\int P(t)\sin 2\omega t\, dt \tag{12}$$

$$\text{Qch} : \int P(t)(-\sin\omega t)\sin\omega t\, dt = -\int P(t)\sin^2\omega t\, dt \tag{13}$$

$$\text{Ich} : \int P(t)\frac{1}{\sqrt{2}}(\cos^2\omega t - \frac{1}{2}\sin 2\omega t)\, dt \tag{14}$$

$$\text{Qch} : \int P(t)\frac{1}{\sqrt{2}}(\frac{1}{2}\sin 2\omega t - \sin^2\omega t)\, dt \tag{15}$$

FIG. 20 ized by QPSK (Quadrature
QUADRATURE DEMODULATOR QUADRATURE DEMODULATION METHOD AND RECORDING MEDIUM

BACKGROUND OF THE INVENTION

The present invention relates to the calibration of a quadrature demodulator.

As an example of a synchronous detector, a quadrature demodulator synchronously detects two baseband signals, i.e., an I signal (in-phase component) and a Q signal (quadrature component) that are in quadrature with each other, such as signals modulated by QPSK (Quadrature PSK). A specific example of a quadrature demodulator 1 will be described with reference to FIG. 26.

First, a frequency conversion section 10 accepts at its input a received signal. The section 10 converts the received signal into an intermediate frequency signal IF of a predetermined frequency and supplies this signal IF to an I signal conversion section 100 and a Q signal conversion section 200. The I signal conversion section 100 receives a local signal of a frequency LF1 from a reference oscillator 40, mixes the local signal with the intermediate frequency signal IF, and generates an I signal (in-phase component). The Q signal conversion section 200 receives from the reference oscillator 40 a local signal of the same frequency LF1 with its phase 90 degree shifted by a 90 degree phase shifter 42, mixes such a local signal with the intermediate frequency signal IF, and generates a Q signal (quadrature component). In response to the I signal (in-phase component) and the Q signal (quadrature component), a succeeding circuit 90 performs a desired operation.

Here, factors such as temperature changes cause errors in the I signal conversion section 100 and the Q signal conversion section 200. These errors are, e.g., amplitude, phase, and offset errors. These errors must be removed, or the sections 100 and 200 must be calibrated, since these errors adversely affect the operation of the succeeding circuit 90.

The following method is available to calibrate the I signal conversion section 100 and the Q signal conversion section 200. The user feeds a calibration signal of a predetermined frequency to the I and Q signal conversion sections 100 and 200. At this point, the quadrature demodulator 1 must stop processing the received signal and adjusts attenuation values and the like of variable attenuators, variable delay units and the like in the I and Q signal conversion sections 100 and 200 to calibrate the sections 100 and 200.

That is, during calibration, the user is not allowed to supply a signal to the quadrature demodulator 1, or the quadrature demodulator 1 must stop its reception.

SUMMARY OF THE INVENTION

The present invention has been made to avoid the above inconvenience, and an object thereof is, therefore, to provide a quadrature demodulator, etc. capable of calibrating the I (Q) signal conversion section without stopping its receiving operation.

According to the present invention described in claim 1, a quadrature demodulator includes: an addition unit for adding a user signal and a pseudo noise to generate a pseudo noise superimposed signal; a signal conversion unit for mixing the pseudo noise superimposed signal with a local signal of a predetermined frequency to generate a converted signal; a first multiplication unit for multiplying the converted signal with the pseudo noise to generate a correlated signal; and a first integration unit for integrating the correlated signal to generate an output.

According to the thus constructed quadrature demodulator, the pseudo noise superimposed signal containing a pseudo noise P(t) is converted into a converted signal by the signal conversion unit. The P(t) term in the converted signal is correlated by the first multiplication unit to become a $P(t)^2$ term in the correlated signal. When $P(t)^2$ is integrated in a sufficiently large interval, it becomes a constant not equal to 0. Hence, the $p(t)^2$ term in the correlated signal is integrated by the first integration unit, and is supplied as a function of the phase error or amplitude error of the signal conversion unit. If P(t) is integrated in a sufficiently large interval, it becomes 0. Therefore, the P(t) term in the correlated signal becomes 0 by the integration unit. Hence, the output of the first integration unit is a function of the phase error or amplitude error of the signal conversion unit. Therefore, the phase error of the signal conversion unit can be measured on the basis of the output of the first integration unit.

The pseudo noise includes but not restricted to M-sequence pseudo random patterns. Namely, assuming that the pseudo noise is P(t), the pseudo noise may be any noise which becomes a constant not equal to 0 when $P(t)^2$ is integrated in a sufficiently large interval and which becomes 0 when P(t) is integrated in a sufficiently large interval.

According to the present invention described in claim 2, a quadrature demodulator according to claim 1, further includes: a reference signal conversion unit for mixing the pseudo noise superimposed signal with the local signal of a predetermined local frequency without amplitude and phase errors to generate a reference converted signal; a second multiplication unit for multiplying the pseudo noise with the reference converted signal to generate a reference correlated signal; and a second integration unit for integrating the reference correlated signal to provide an output.

According to the thus constructed quadrature demodulator, the reference signal conversion unit has no amplitude and phase errors, and thus the output of the second integration unit contains no amplitude and phase errors. Hence, by comparing the output of the first integration unit containing an amplitude error with the output of the second integration unit containing no amplitude and phase errors, the amplitude error can be measured.

According to the present invention described in claim 3, a quadrature demodulator according to claim 2, further includes: an amplitude error correction unit for correcting an amplitude error of the signal conversion unit; and an average calculation unit for obtaining an average of the converted signals from the signal conversion unit.

A DC offset error can be calculated by the average calculation unit.

According to the present invention described in claim 4, a quadrature demodulator according to claim 1, further includes a phase error correction unit for adjusting the phase of the local signal to be supplied to the signal conversion unit so that the output of the first integration unit equals a predetermined value.

According to the present invention described in claim 5, a quadrature demodulator according to claim 2, further includes amplitude error measurement unit for obtaining an amplitude error on the basis of a value obtained by dividing the predetermined value, which is one of the outputs of the first integration unit, by the output of the second integration unit.

The present invention described in claim 6, is a quadrature demodulator according to claim 4 or 5, wherein the predetermined value is a maximum output value of the first integration unit.

The present invention described in claim 7, is a quadrature demodulator according to claim 1, wherein the pseudo noise is smaller than the user signal.

The present invention described in claim 8, is a quadrature demodulator according to claim 7, wherein the pseudo noise is substantially equal to a floor noise.

The present invention described in claim 9, is a quadrature demodulator according to claim 1, which further includes: a quadrature signal conversion unit for mixing a quadrature local signal with the pseudo noise superimposed signal to generate a quadrature converted signal, the quadrature local signal being obtained by shifting the phase of the local signal by 90 degree; a quadrature multiplication unit for multiplying the quadrature converted signal with the pseudo noise to generate a quadrature correlated signal; and a quadrature integration unit for integrating the quadrature correlated signal to provide an output.

The present invention described in claim 10, is a quadrature demodulator according to claim 9, wherein the quadrature multiplication unit is shared with the first multiplication unit; the quadrature integration unit is shared with the first integration unit; and a connection switching unit is provided so as to connect any one of the signal conversion unit and the quadrature signal conversion unit to the quadrature multiplication unit.

The present invention described in claim 11, is a quadrature demodulator according to claim 1, which further includes a pseudo noise mixing unit for mixing the pseudo noise with the local signal to supply an output thereof to the addition unit.

The present invention described in claim 12, is a quadrature demodulator according to claim 1, which further includes: a user signal conversion unit for mixing the user signal with the local signal of a predetermined local frequency to generate a converted user signal; and a subtraction unit for subtracting the converted user signal from the converted signal to supply an output thereof to the first multiplication unit; wherein the first multiplication unit multiplies the output of the subtraction unit with the pseudo noise to generate a correlated signal.

The subtraction unit subtracts the converted user signal from the converted signal and provides an output, and such output is integrated. Assuming that the pseudo noise is P(t), only the P(t) term remains after the converted user signal is subtracted from the converted signal. Therefore, error measurements become less affected by the user signal.

The present invention described in claim 13, is a quadrature demodulator according to claim 12, which further includes amplitude error measurement unit for obtaining an amplitude error on the basis of a value obtained by dividing a predetermined value, which is one of the outputs of the first integration unit, by a predicted output of the first integration unit obtained if no amplitude and phase errors are supposed to exist.

The "predetermined value" unit a value obtained with the phase error removed, and is a function of the amplitude error. When such value is divided by a predicted output of the first integration unit that would be obtained if there were no amplitude and phase errors, the amplitude error can be obtained from such value since such value is a function of the amplitude error.

The present invention described in claim 14, is a quadrature demodulator according to claim 13, wherein the predetermined value is a maximum output value of the first integration unit.

The present invention described in claim 15, is a quadrature demodulator according to claim 13, which further includes: an amplitude error correction unit for correcting an amplitude error of the signal conversion unit; and an average calculation unit for obtaining an average of the converted signals from the signal conversion unit.

A DC offset error can be calculated by the average calculation unit.

The present invention described in claim 16, is a quadrature demodulator according to claim 12, which further includes a phase error correction unit for adjusting the phase of the local signal to be supplied to the signal conversion unit so that the output of the first integration unit becomes maximum.

The present invention described in claim 17, is a quadrature demodulator according to claim 12, wherein the pseudo noise is smaller than the user signal.

The present invention described in claim 18, is a quadrature demodulator according to claim 17, wherein the pseudo noise is substantially equal to a floor noise.

The present invention described in claim 19, is a quadrature demodulator according to claim 12, which further includes: a quadrature signal conversion unit for mixing a quadrature local signal with the pseudo noise superimposed signal to generate a quadrature converted signal, the quadrature local signal being obtained by shifting the phase of the local signal by 90 degree; a quadrature subtraction unit for subtracting the converted user signal from the quadrature converted signal; a quadrature multiplication unit for multiplying an output of the quadrature subtraction unit with the pseudo noise to generate a quadrature correlated signal; and a quadrature integration unit for integrating the quadrature correlated signal to generate an output.

The present invention described in claim 20, is a quadrature demodulator according to claim 19, wherein the quadrature multiplication unit is shared with the first multiplication unit; the quadrature integration unit is shared with the first integration unit; and connection switching unit is provided so as to connect any one of the signal conversion unit and the quadrature signal conversion unit to the quadrature multiplication unit.

The present invention described in claim 21, is a quadrature demodulator according to claim 12, which further includes pseudo noise mixing unit for mixing the pseudo noise with the local signal to supply an output thereof to the addition unit.

The present invention described in claim 22, is a quadrature demodulator, which includes: a phase shift unit for changing the phase of a pseudo noise to provide an output; an addition unit for adding a user signal and the output of the phase shift unit to generate a pseudo noise superimposed signal; a signal conversion unit for mixing the pseudo noise superimposed signal with a local signal of a predetermined local frequency to generate a converted signal; a quadrature signal conversion unit for mixing a quadrature local signal with the pseudo noise superimposed signal to generate a quadrature converted signal, the quadrature local signal being obtained by shifting the phase of the local signal by 90 degree; a multiplication unit for multiplying the pseudo noise with the converted signal to generate a correlated signal; a quadrature multiplication unit for multiplying the pseudo noise with the quadrature converted signal to generate a quadrature correlated signal; an integration unit for integrating the correlated signal to provide an output; and a quadrature integration unit for integrating the quadrature correlated signal to provide an output.

According to the thus constructed quadrature demodulator, a complete round is obtained if there were no errors with the horizontal axis indicating the outputs of the first integration unit and the vertical axis indicating the outputs of the second integration unit. However, the complete round is deformed into an ellipse if there is an error. Therefore, errors, such as phase errors, can be obtained from the degree of deformation of the complete round.

The present invention described in claim 23, is a quadrature demodulator according to claim 22, which further includes an error measurement unit for measuring a DC offset error, a phase error, and an amplitude error on the basis of the outputs of the integration unit and the quadrature integration unit.

The present invention described in claim 24, is a quadrature demodulator according to claim 23, wherein the error measurement unit neglects at least one of the DC offset error, the phase error, and the amplitude error and measures an unneglected error.

The present invention described in claim 25, is a quadrature demodulator according to claim 22, wherein the pseudo noise is smaller than the user signal.

The present invention described in claim 26, is a quadrature demodulator according to claim 25, wherein the pseudo noise is substantially equal to a floor noise.

The present invention described in claim 27, is a quadrature demodulator according to claim 22, which further includes a pseudo noise mixing unit for mixing the pseudo noise with the local signal to supply an output thereof to the addition unit.

The present invention described in claim 28, is a quadrature demodulator according to claim 22, wherein the quadrature multiplication unit is shared with the multiplication unit; the quadrature integration unit is shared with the integration unit; and connection switching unit is provided so as to connect any one of the signal conversion unit and the quadrature signal conversion unit to the quadrature multiplication unit.

The present invention described in claim 29, is a quadrature demodulator according to claim 22, which further includes: a user signal conversion unit for mixing the user signal with the local signal of a predetermined local frequency to generate a converted user signal; a subtraction unit for subtracting the converted user signal from the converted signal to supply an output thereof to a multiplication unit; a quadrature subtraction unit for subtracting the converted user signal from the quadrature converted signal to supply an output thereof to a quadrature multiplication unit; wherein the multiplication unit generates a correlated signal obtained by multiplying the output of the subtraction unit with the pseudo noise, and the quadrature multiplication unit generates a quadrature correlated signal obtained by multiplying the output of the quadrature subtraction unit with the pseudo noise.

The present invention described in claim 30, is a quadrature demodulation method, which includes: an addition step for adding a user signal and a pseudo noise to generate a pseudo noise superimposed signal; a signal conversion step for mixing the pseudo noise superimposed signal with a local signal of a predetermined frequency to generate a converted signal; a first multiplication step for multiplying the converted signal with the pseudo noise to generate a correlated signal; and a first integration step for integrating the correlated signal to generate an output.

The present invention described in claim 31, is a quadrature demodulation method according to claim 30, which further includes: a reference signal conversion step for mixing the pseudo noise superimposed signal with the local signal of a predetermined local frequency without amplitude and phase errors to generate a reference converted signal; a second multiplication step for multiplying the pseudo noise with the reference converted signal to generate a reference correlated signal; a second integration step for integrating the reference correlated signal to provide an output; an amplitude error correction step for correcting an amplitude error of the signal conversion step; and an average calculation step for obtaining an average of the converted signals from the signal conversion step.

The present invention described in claim 32, is a quadrature demodulation method, which includes: a phase shift step for changing the phase of a pseudo noise to provide an output; an addition step for adding a user signal and the output of the phase shift step to generate a pseudo noise superimposed signal; a signal conversion step for mixing the pseudo noise superimposed signal with a local signal of a predetermined local frequency to generate a converted signal; a quadrature signal conversion step for mixing a quadrature local signal with the pseudo noise superimposed signal to generate a quadrature converted signal, the quadrature local signal being obtained by shifting the phase of the local signal by 90 degree; a multiplication step for multiplying the pseudo noise with the converted signal to generate a correlated signal; a quadrature multiplication step for multiplying the pseudo noise with the quadrature converted signal to generate a quadrature correlated signal; an integration step for integrating the correlated signal to provide an output; and a quadrature integration step for integrating the quadrature correlated signal to provide an output.

The present invention described in claim 33, is a quadrature demodulation method according to claim 32, which further includes the steps of: providing an I axis and a Q axis, the axes being in quadrature with each other; assigning an output of the integration step to one of the I axis and the Q axis, and assigning an output of the quadrature integration step to the other one of the I axis and the Q axis; depicting an eclipse passing through coordinates defined by the I axis and the Q axis; and obtaining a DC offset error, a phase error, and an amplitude error from the eclipse.

The present invention described in claim 34, is a computer-readable medium embodying a program of instructions for execution by the computer to perform a quadrature demodulation method, which includes: an addition step for adding a user signal and a pseudo noise to generate a pseudo noise superimposed signal; a signal conversion step for mixing the pseudo noise superimposed signal with a local signal of a predetermined frequency to generate a converted signal; a first multiplication step for multiplying the converted signal with the pseudo noise to generate a correlated signal; and a first integration step for integrating the correlated signal to generate an output.

The present invention described in claim 35, is a computer-readable medium according to claim 34, wherein the quadrature demodulation method, which further includes: a reference signal conversion step for mixing the pseudo noise superimposed signal with the local signal of a predetermined local frequency without amplitude and phase errors to generate a reference converted signal; a second multiplication step for multiplying the pseudo noise with the reference converted signal to generate a reference correlated signal; a second integration step for integrating the reference correlated signal to provide an output; an amplitude error correction step for correcting an amplitude error of the signal conversion step; and an average calculation step for obtaining an average of the converted signals from the signal conversion step.

The present invention described in claim 36, is a computer-readable medium embodying a program of instructions for execution by the computer to perform a quadrature demodulation method, which includes: a phase shift step for changing the phase of a pseudo noise to provide an output; an addition step for adding a user signal and the output of the phase shift step to generate a pseudo noise superimposed signal; a signal conversion step for mixing the pseudo noise superimposed signal with a local signal of a predetermined local frequency to generate a converted signal; a quadrature signal conversion step for mixing a quadrature local signal with the pseudo noise superimposed signal to generate a quadrature converted signal, the quadrature local signal being obtained by shifting the phase of the local signal by 90 degree; a multiplication step for multiplying the pseudo noise with the converted signal to generate a correlated signal; a quadrature multiplication step for multiplying the pseudo noise with the quadrature converted signal to generate a quadrature correlated signal; an integration step for integrating the correlated signal to provide an output; and a quadrature integration step for integrating the quadrature correlated signal to provide an output.

The present invention described in claim 37, is a computer-readable medium according to claim 36, wherein the quadrature demodulation method further includes the steps of providing an I axis and a Q axis, the axes being in quadrature with each other; assigning an output of the integration step to one of the I axis and the Q axis, and assigning an output of the quadrature integration step to the other one of the I axis and the Q axis; depicting an eclipse passing through coordinates defined by the I axis and the Q axis; and obtaining a DC offset error, a phase error, and an amplitude error from the eclipse.

The present invention described in claim 38, is a quadrature demodulator, which includes: an addition device that adds a user signal and a pseudo noise to generate a pseudo noise superimposed signal; a signal conversion device that mixes the pseudo noise superimposed signal with a local signal of a predetermined frequency to generate a converted signal; a first multiplication device that multiplies the converted signal with the pseudo noise to generate a correlated signal; and a first integration device that integrates the correlated signal to generate an output.

The present invention described in claim 39, is a quadrature demodulator, which includes: a phase shift device that changes the phase of a pseudo noise to provide an output; an addition device that adds a user signal and the output of the phase shift device to generate a pseudo noise superimposed signal; a signal conversion device that mixes the pseudo noise superimposed signal with a local signal of a predetermined local frequency to generate a converted signal; a quadrature signal conversion device that mixes a quadrature local signal with the pseudo noise superimposed signal to generate a quadrature converted signal, the quadrature local signal being obtained by shifting the phase of the local signal by 90 degree; a multiplication device that multiplies the pseudo noise with the converted signal to generate a correlated signal; a quadrature multiplication device that multiplies the pseudo noise with the quadrature converted signal to generate a quadrature correlated signal; an integration device that integrates the correlated signal to provide an output; and a quadrature integration device that integrates the quadrature correlated signal to provide an output.

BRIEF DESCRIPTION OF THE DRAWINGS

FIG. 5 is a list of equations for illustrating the operation of the first embodiment;

FIG. 15 is a diagram showing the operation of the third embodiment;

FIG. 20 is a list of equations for illustrating the operation of the fifth embodiment;

DETAILED DESCRIPTION OF THE INVENTION

Embodiments of the present invention will hereinafter be described with reference to the drawings.

First Embodiment

Figure 1:
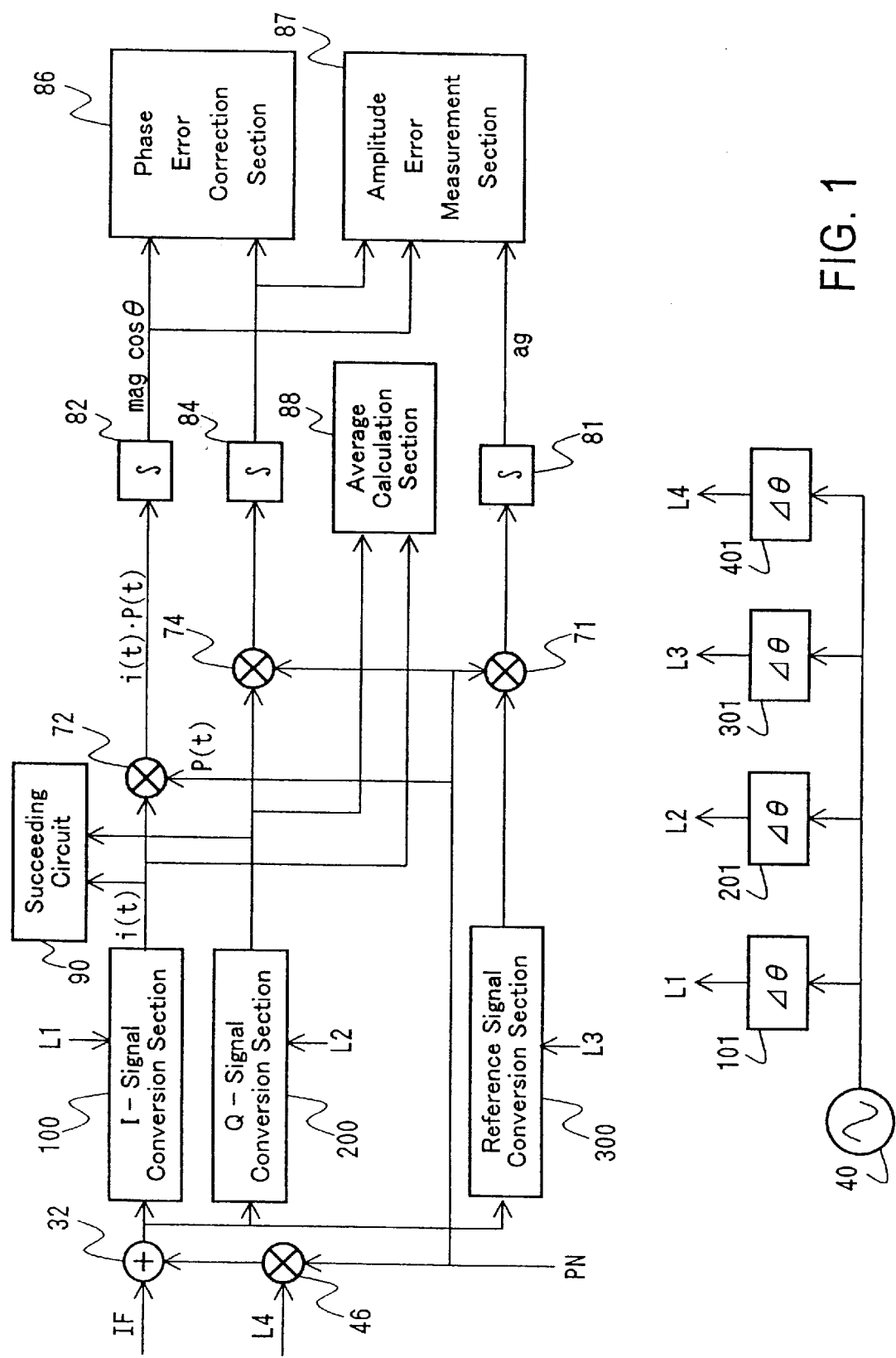
FIG. 1 is a block diagram showing the construction of a quadrature demodulator according to a first embodiment of the present invention.

FIG. 1 is a block diagram showing the construction of a quadrature demodulator according to a first embodiment of the present invention. The quadrature demodulator according to the first embodiment comprises an adder 32, a pseudo noise mixer/multiplier 46, an I signal conversion section 100, a Q signal conversion section 200, a reference signal conversion section 300, a succeeding circuit 90, a first multiplier 72, a second multiplier 71, a quadrature multiplier 74, a first integrator 82, a second integrator 81, a quadrature integrator 84, a phase error correction section 86, an amplitude error measurement section 87, an average calculation section 88, a reference oscillator 40, and phase shifters 101, 201, 301 and 401.

The reference oscillator 40 generates a local signal of a predetermined local frequency. The phase shifters 101, 201, 301 and 401 each change the phase of the local signal from the reference oscillator 40. Note that the amount of phase shifted by the phase shifters 101, 201, 301 and 401 is variable. Further, the phase shifter 101 provides an output that is 90 degree out of phase with that of the phase shifter 201. This is to have the phase of a signal emerging from the I signal conversion section 100 in quadrature with the phase of a signal emerging from the Q signal conversion section 200. A local signal L1 generated by the phase shifter 101 is supplied to the I signal conversion section 100. A local signal L2 generated by the phase shifter 201 is supplied to the Q signal conversion section 200. A local signal L3 generated by the phase shifter 301 is supplied to the reference signal conversion section 300. A local signal L4 generated by the phase shifter 401 is supplied to the pseudo noise mixer/multiplier 46.

The pseudo noise mixer/multiplier 46 mixes a pseudo noise PN with the local signal L4 by multiplication. The pseudo noise PN is, e.g., an M-sequence pseudo random pattern and generates a long cycle random pattern in which the probability of generating a binary sequence is almost 50%. That is, at a cycle of n=$2^m$−1, $2^{m-1}$ high-level signals and $2^{m-1}$−1 low-level signals are generated. However, the pseudo noise PN used herein may be any noise which, assuming the pseudo noise to be P(t), becomes a constant not equal to 0 when the $p(t)^2$ is integrated in a sufficiently large interval and becomes 0 when P(t) is integrated in a sufficiently large interval. Thus, the pseudo noise PN is not necessarily limited to an M-sequence pseudo random pattern.

The adder 32 adds up a user signal and an output signal of the pseudo noise mixer/multiplier 46 and generates a pseudo noise superimposed signal. The user signal used herein means an intermediate frequency (IF) signal obtained by converting a received signal accepted by the quadrature demodulator into a signal belonging to an intermediate frequency band by a frequency conversion section (not shown). However, the user signal is not intended to be limited to an IF signal. In short, any signal having a certain frequency can be a user signal. Note that the pseudo noise is preferably a signal as feeble as a floor noise when compared with the user signal so that the pseudo noise will not disturb the succeeding circuit 90 when the circuit 90 processes the user signal.

Figure 2:
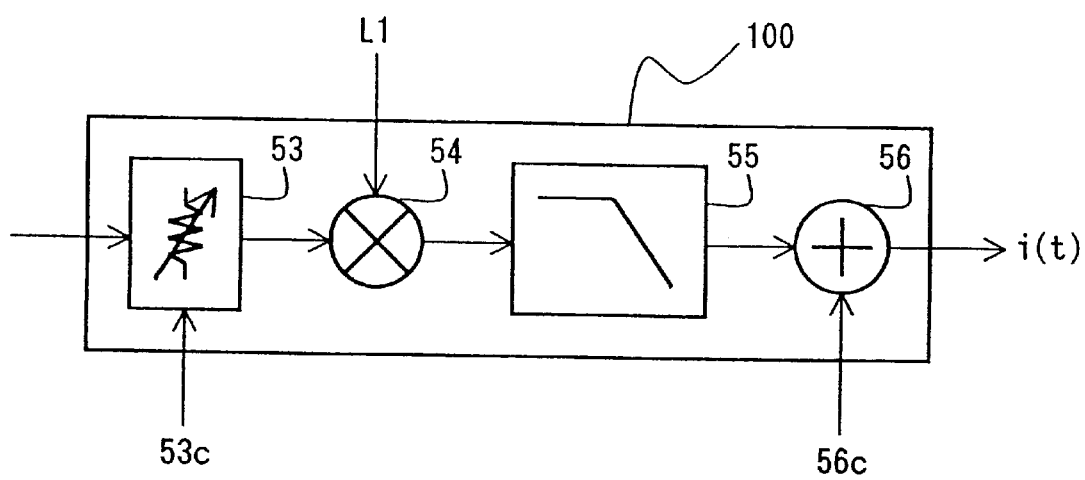
FIG. 2 is a block diagram showing the internal construction of an I signal conversion section 100.

The I signal conversion section (signal conversion section) 100 mixes the pseudo noise superimposed signal with the local signal L1 and generates a converted signal. The internal construction of the I signal conversion section 100 is shown in FIG. 2. The section 100 has a variable attenuator 53, a quadrature mixer 54, a lowpass filter 55, and an offset adder 56. The pseudo noise superimposed signal has its amplitude adjusted by the variable attenuator 53. Then, the amplitude-adjusted signal is mixed with the local signal L1 by the quadrature mixer 54, and the mixed signal has its high frequency component cut off by the lowpass filter 55 and, at the same time, integrated. Finally, the resultant signal has its DC offset adjusted with the addition of a DC offset control input 56c to be generated as a converted signal i(t).

Note that an amplitude control input 53c is supplied from the amplitude error measurement section 87 to the variable attenuator 53 to control the rate of attenuation of the variable attenuator 53 and to thereby remove an amplitude error. The DC offset control input 56c is supplied from the average calculation section 88 to the offset adder 56 to control the amount of addition of the offset adder 56 and to thereby remove a DC offset error. Note further that a phase error is removed by the phase shifter 101 that determines the phase of the local signal L1. The phase shifter 101 adjusts the phase shifting amount to remove the phase error.

The first multiplier 72 correlates the converted signal i(t) with the pseudo noise P(t) by multiplication to generate a correlated signal i(t)·P(t). The first integrator 82 integrates the correlated signal to provide an output.

The Q signal conversion section (quadrature signal conversion section) 200 has a construction similar to that of the I signal conversion section 100, but the section 200 mixes the local signal L2 with the pseudo noise superimposed signal to generate a quadrature converted signal. The quadrature multiplier 74 correlates the quadrature converted signal from the Q signal conversion section 200 with the pseudo noise P(t) by multiplication to generate a quadrature correlated signal. The quadrature integrator 84 integrates the quadrature correlated signal to provide an output.

The reference signal conversion section 300 has a construction similar to that of the I signal conversion section 100, but the section 300 mixes the local signal L3 with the pseudo noise superimposed signal to generate a reference converted signal. Additionally, the section 300 is not directly involved in reception, and has amplitude and phase errors removed in advance. Further, the amplitude control input 53c and the DC offset control input 56c supplied to the reference signal conversion section 300 are to be adjusted by the user, and thus the amplitude error measurement section 87 and the average calculation section 88 have nothing to do with the section 300.

The second multiplier 71 correlates the reference converted signal from the reference signal conversion section 300 with the pseudo noise P(t) by multiplication to generate a reference correlated signal. The second integrator 81 integrates the reference correlated signal to provide an output.

The phase error correction section 86 adjusts the amounts of phase shifted by the phaser shifters 101 and 201 on the basis of the outputs of the first integrator 82 and the quadrature integrator 84 to correct the phase errors of the I and Q signal conversion sections 100 and 200, respectively. The amplitude error measurement section 87 measures the amplitude errors of the I and Q signal conversion sections 100 and 200 on the basis of the outputs of the first integrator 82 and the quadrature integrator 84 and the output of the second integrator 81. Further, the amplitude error measurement section 87 maybe designed in such a way that the section 87 feeds the amplitude control input 53c to the I and Q signal conversion sections 100 and 200 to correct their amplitude errors. The average calculation section 88 obtains an average of the amplitude and phase error removed outputs of the I and Q signal conversion sections 100 and 200 to calculate their DC offsets. The succeeding circuit 90 performs a desired operation in response to the converted signal and the quadrature converted signal.

Figure 3:
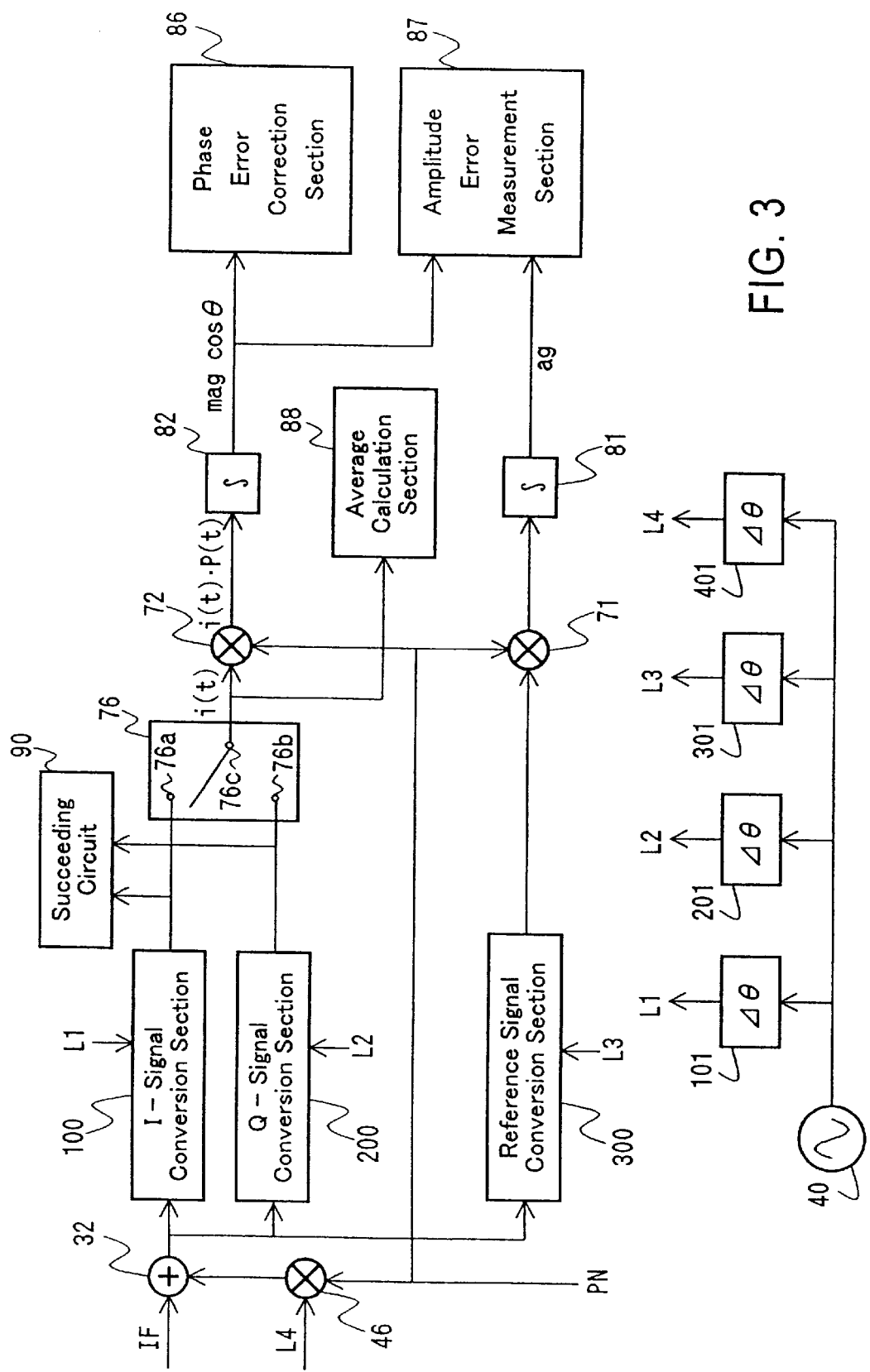
FIG. 3 is a diagram showing the construction including a selector switch 76.

Note that the quadrature multiplier 74 can be incorporated into the first multiplier 72 and the quadrature integrator 84 into the first integrator 82. The thus modified construction is shown in FIG. 3. That is, a selector switch 76 is provided so as to switch the connection of a terminal 76c on the first multiplier 72 side between a terminal 76a on the I signal conversion section 100 side and a terminal 76b on the Q signal conversion section 200 side.

Figure 4:
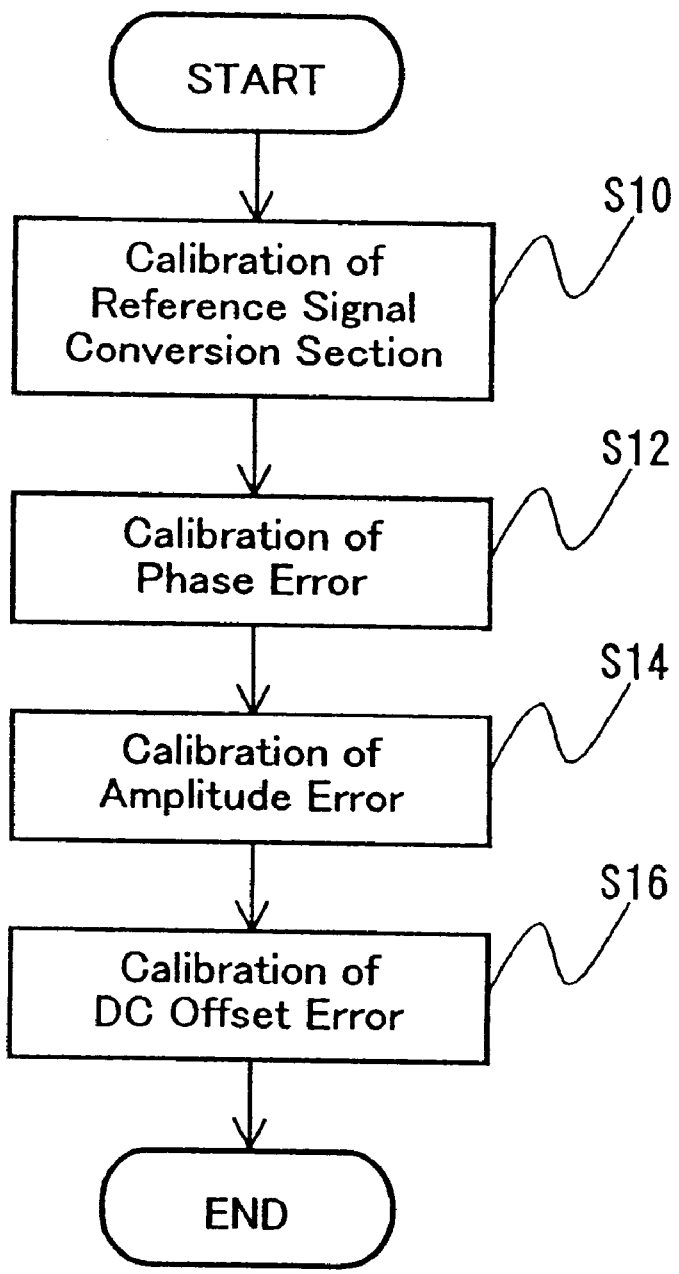
FIG. 4 is a flowchart showing the operation of the first embodiment.

Next, the operation of the first embodiment of the present invention will be described. FIG. 4 is a flowchart showing the operation of the first embodiment.

First, the reference signal conversion section 300 is calibrated (S10). For the calibration, a conventional method is used. Since the reference signal conversion section 300 does not receive any signal, it can be calibrated with the conventional method without stopping the receiving operation performed by the quadrature demodulator. That is, a signal having a predetermined frequency is fed to the reference signal conversion section 300. Then the amplitude control input 53c for the reference signal conversion section 300 is adjusted to remove an amplitude error. Further, the phase shifter 301 adjusts the phase shifting amount to remove a phase error. Note that the DC offset control input 56c may also be adjusted to remove a DC offset error.

Next, the phase error of the I signal conversion section 100 is calibrated (S12). Let the user signal (IF signal) be I(t), Q(t), ψ be the phase difference between the user signal and the pseudo noise, P(t) be the pseudo noise, "a" be the attenuating amount for the pseudo noise, "m" be the amplitude error, $\theta$ be the phase error, and "d" be the DC offset error. Then the converted signal i(t) from the I signal conversion section 100 is expressed as equation (1) of FIG. 5. The converted signal i(t), when multiplied with the pseudo noise P(t) by the multiplier 72, becomes the correlated signal i(t)·P(t) that is expressed as equation (2) of FIG. 5. The correlated signal i(t)·P(t), when integrated by the first integrator 82, becomes an integrated signal that is expressed as equation (3) of FIG. 5. That is, the term including $p(t)^2$ is multiplied with a process gain of g, while the term including P(t) is diverged to be negligible.

Figure 6:
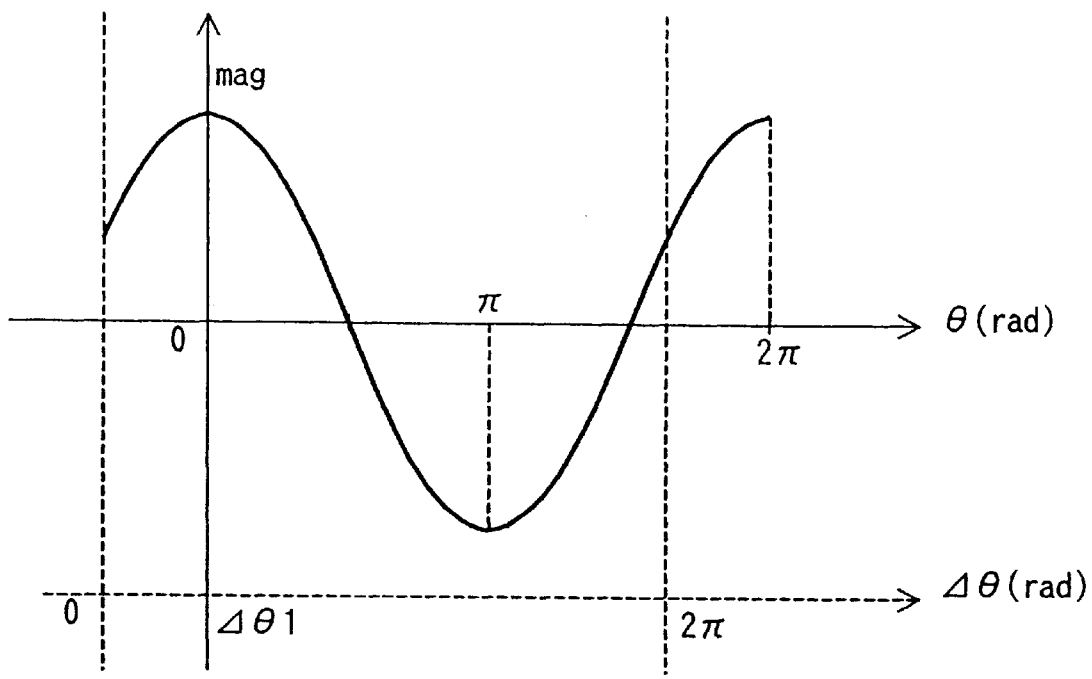
FIG. 6 is a conceptional diagram showing an exemplary operation of a phase error correction section 86.

As is apparent from equation (3) of FIG. 5, the output of the first integrator 82 takes the maximum value mag when $\theta=0$, i.e., when the phase error is 0. The phase error correction section 86 measures every output of the first integrator 82, and then adjusts the amount of phase to be shifted by the phase shifter 101 so that the output of the first integrator 82 is maximized. Such a phase error correction can be made, e.g., as shown in FIG. 6, by changing the phase shifting amount (referred to as "Δθ") in a range between 0 and 2π radians, recording a value (referred to as "Δθ") of phase shifting amount obtained when the output of the first integrator 82 is maximized, and setting Δθ=Δθ1.

Note that if, e.g., the phaser shifter is inserted immediately after the I signal conversion section 100, then maP(t) cos(θ+45 degree) might result from the integration performed by the first integrator 82, and in such a case, Δθ should be adjusted to a value obtained by dividing the maximum value by √2.

Note that the phase error of the Q signal conversion section 200 can similarly be calibrated.

Further, the converted signal from the I signal conversion section 100 and the quadrature converted signal from the Q signal conversion section 200 are fed to the succeeding circuit 90. The succeeding circuit 90 processes the converted signal and the quadrature converted signal in a desired way. The converted signal and the quadrature converted signal contain pseudo noise. However, the pseudo noise, which is merely a signal as feeble as a floor noise when compared with the user signal, does not affect the succeeding circuit 90 for its processing. Hence, the phase error of the I signal conversion section 100 is calibrated while the succeeding circuit 90 is performing its receiving operation.

Next, the amplitude error of the I signal conversion section 100 is calibrated (S14). Let the user signal (IF signal) be I(t), Q(t), ψ be the phase difference between the user signal and the pseudo noise, and P(t) be the pseudo noise. Then the reference converted signal from the reference signal conversion section 300 is expressed as equation (4) of FIG. 5. The reference converted signal, when multiplied with the pseudo noise P(t) by the second multiplier 71, becomes the reference correlated signal, and the reference correlated signal, when integrated by the second integrator 81, becomes an integrated signal that is expressed as equation (5) of FIG. 5. That is, when m=0 and θ=0 in equation (3) of FIG. 5, ag is obtained. Here the amplitude error measurement section 87 obtains an amplitude error m, as indicated by equation (6) of FIG. 5, by dividing by the output ag of the second integrator 81 the output mag of the first integrator 82 from which the phase error of the I signal conversion section 100 has been removed.

The amplitude error measurement section 87 further adjusts the amplitude control input 53c for the I signal conversion section 100 to calibrate an amplitude error. For example, when obtained amplitude error is m=2, i.e., when the amplitude is doubled, the section 87 adjusts the amplitude control input 53c in such a way that the variable attenuator 53 halves the amplitude to obtain m=1 (no amplitude error).

Note that the amplitude error of the Q signal conversion section 200 can similarly be calibrated.

Finally, the DC offset error of the I signal conversion section 100 is calibrated (S16). Since m=1 and θ=0 with the amplitude and phase errors already removed, the output of the I signal conversion section 100 is expressed as equation (7) of FIG. 5, which is obtained by substituting m=1 and θ=0 for equation (1) of FIG. 5. Here, by obtaining an average of the results of equation (7) of FIG. 5, the cosine and sine terms and the P(t) term become 0. Hence, only d remains. In view of this fact, the average calculation section 88 calculates the DC offset of the I signal conversion section 100 by obtaining an average of the outputs of the section 100 from which amplitude and phase errors have been removed. Then the DC offset error of the I signal conversion section 100 is corrected by giving, as the DC offset control input 56c, a signal having an equal magnitude and an opposite sign to the obtained DC offset.

Note that the DC offset error of the Q signal conversion section 200 can similarly be calibrated.

According to the first embodiment of the present invention, a pseudo noise is contained in the converted signal from the I signal conversion section 100 and the quadrature converted signal from the Q signal conversion section 200. However, the pseudo noise, which is merely a signal as feeble as a floor noise when compared with the user signal, does not affect the processing performed by the succeeding circuit 90. Additionally, this pseudo noise can be utilized to calibrate the I and Q signal conversion sections 100 and 200.

That is, while phase, amplitude and DC offset errors of the I and Q signal conversion sections 100 and 200 are being calibrated, the succeeding circuit 90 can process the converted signal and the quadrature converted signal in a desired way.

Second Embodiment

Figure 7:
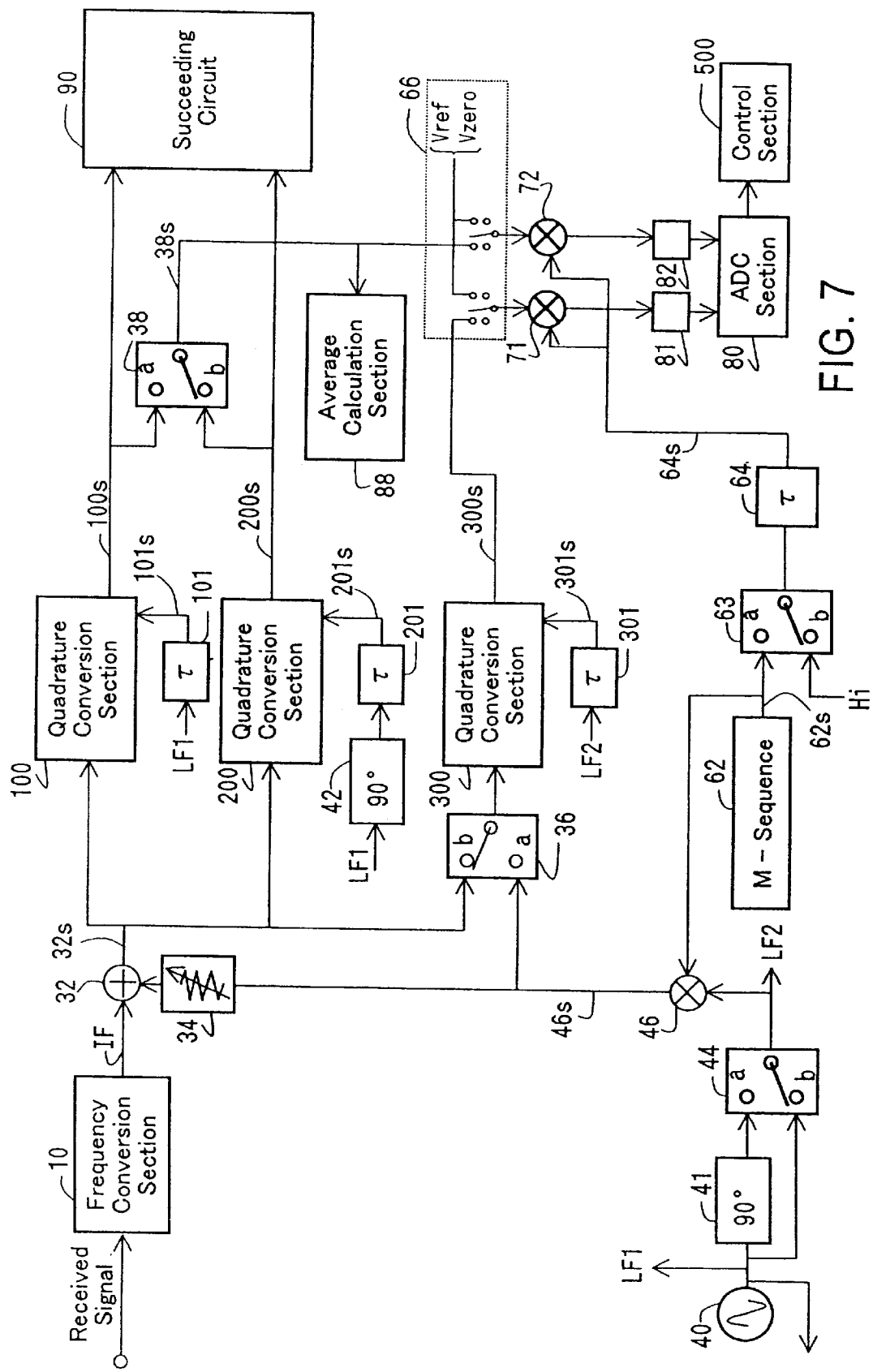
FIG. 7 is a block diagram showing the construction of a quadrature demodulator according to a second embodiment of the present invention.

A second embodiment is obtained by further materializing the construction of the first embodiment. FIG. 7 is a block diagram showing the construction of the second embodiment.

The main construction of a quadrature demodulator of the present invention comprises, as shown in FIG. 7, a frequency conversion section 10, an I-side quadrature conversion section 100, a Q-side quadrature conversion section 200, a succeeding circuit 90, a reference oscillator 40, 90 degree phase shifters 41 and 42, selector switches 44, 36, 38 and 63, a mixer 46, a reference quadrature conversion section 300, an attenuator 34, a combiner 32, variable phase shifters 101, 201, 301 and 64, an M-sequence generation section 62, a detector calibration section 66, multipliers 71 and 72, integration section 81 and 82, an ADC section 80, and a control section 500.

The frequency conversion section 10 is an ordinary frequency converter. In response to a received signal accepted from an external device, the section 10 causes its built-in local oscillator to convert the frequency of the received signal to generate an intermediate frequency signal IF of a predetermined frequency. Note that intermediate frequency signals IF having relatively high intermediate frequencies, such as 100 MHz or higher, would be applied, supposing that a baseband width of, e.g., 10 MHz or higher is required.

The reference oscillator 40 is used to perform any of the following functions. First, the oscillator 40 generates a local frequency signal LF1 synchronized with the intermediate frequency signal IF from the frequency conversion section 10, the signal LF1 having the same frequency as the signal IF. Second, the oscillator 40 supplies its own frequency signal to the external device as a reference signal to maintain synchronization. Third, the oscillator 40 may generate a local frequency signal LF1 unsynchronized with the intermediate frequency signal IF when the succeeding circuit 90 is provided with the function of correcting I/Q separation deviations through a separation process. Let it be supposed here that the reference oscillator 40 supplies to the external device a local frequency signal LF1 synchronized with the intermediate frequency signal IF.

The succeeding circuit 90 performs a desired operation in response to baseband signals, which are an I signal (in-phase component) and a Q signal (quadrature component) obtained from the quadrature signals from the I- and Q-side signal conversion sections 100 and 200, respectively. Or, there is a circuit 90 that incorporates a digital process-based separation function for correcting I/Q separation deviations to obtain normally separated I and Q signals.

The reference quadrature conversion section 300 has the same internal construction as the I- and Q-side quadrature conversion sections 100 and 200, receives via the variable phase shifter 301 and synchronously detects a local frequency signal LF2, and supplies a detected signal 300s to the one multiplier 71 via the detector calibration section 66.

The I- and Q-side quadrature conversion sections 100 and 200 have the same internal construction, and synchronously detect I and Q signals that differ mutually 90 degree in phase to provide outputs, respectively. The I-side quadrature conversion section 100 generates an I signal 100s obtained through quadrature synchronous detection, and the Q-side quadrature conversion section 200 generates a Q signal 200s obtained through quadrature synchronous detection.

Figure 8:
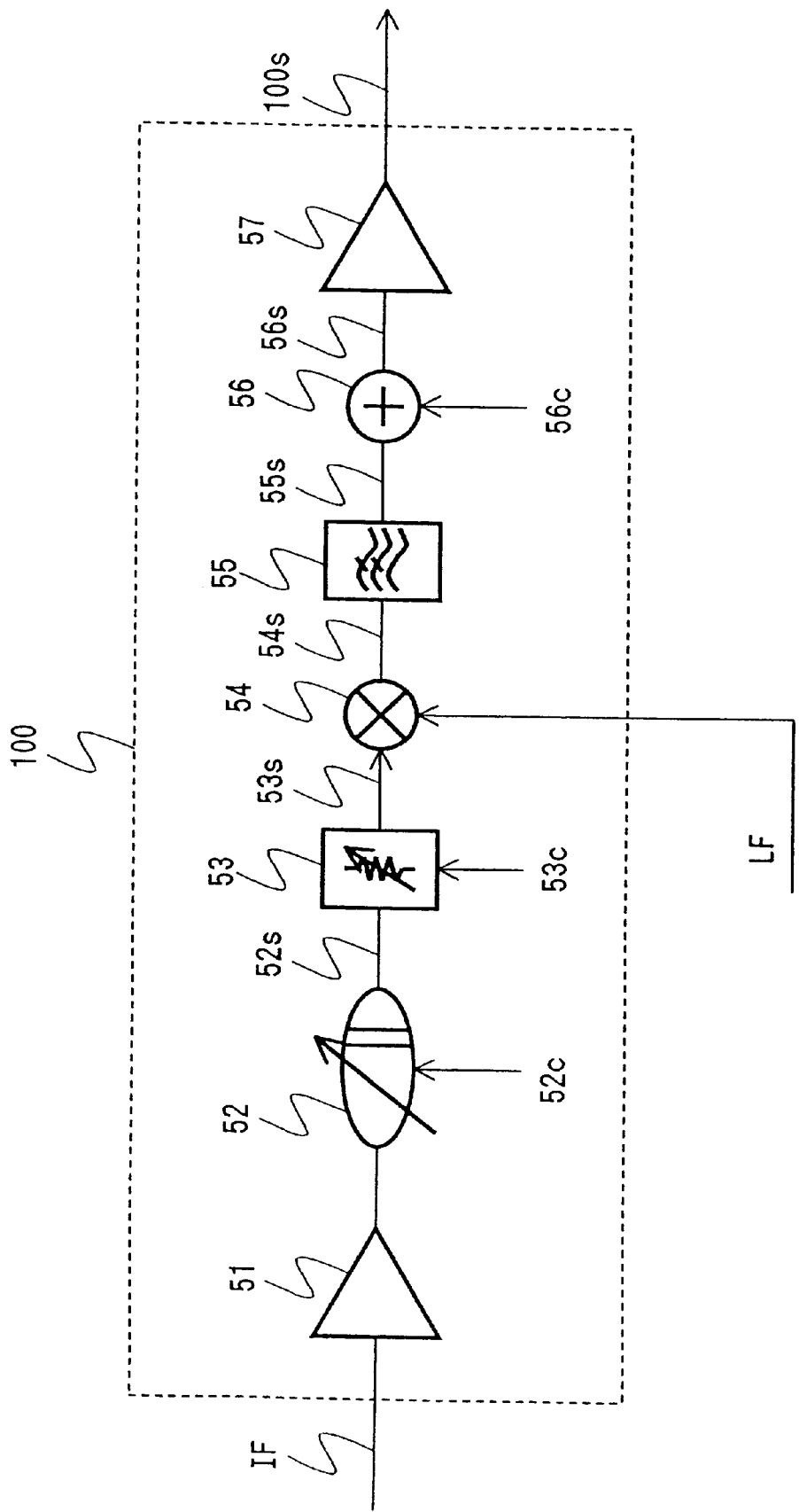
FIG. 8 is a block diagram showing the internal construction of an I signal conversion section 100.

An exemplary internal construction of the I-side quadrature conversion section 100 that detects the I signal, which is one of the quadrature signals, is as shown in FIG. 8. The section 100 comprises a high frequency amplifier 51, a variable delay unit 52, a variable attenuator 53, a quadrature mixer 54, a lowpass filter 55, an offset adder 56, and a buffer amplifier 57.

The high frequency amplifier 51 receives the intermediate frequency signal IF from the frequency conversion section 10 to generate an IF signal amplified and buffered in a prescribed way.

The variable delay unit 52 is designed to finely adjust the IF signal so that the IF signal reaches the input terminals of both I- and Q-side quadrature mixers 54 at the same timing, and delivers to the next stage an IF signal 52s finely adjusted on the basis of a delay amount control signal 52c from the control section 500.

The variable attenuator 53 is designed to adjust the amplitude level of the I and Q output signals 100s and 200s. The attenator 53 generates a properly attenuated IF signal 53s obtained on the basis of an attenuation amount control signal 53c from the control section 500. Note that an amplitude adjustment technique based on a variable gain amplifier is also available other than attenuation control.

The quadrature mixer 54, which is a mixer (multiplier) using, e.g., freewheeling diodes, receives at one of its input terminals the properly timing- and amplitude-adjusted IF signal 53s from the variable attenuator 53 and at the other input terminal the local frequency signal LF1 having the same frequency as the carrier frequency of the IF signal 53s and having the same phase as the signal 53s, and generates an I component signal 54s obtained by frequency-converting both signals 53s and LF1 and synchronously quadrature-detecting the frequency-converted signals. Note that the I component signal 54s to be generated by the mixer 54 contains a DC offset component derived from quadrature mixer's unbalance, temperature changes and the like, and a DC offset component derived from a phase deviation between the carrier frequency of the intermediate frequency signal IF and the carrier frequency of the local frequency signal LF1.

The lowpass filter 55 is a low-frequency passing filter that removes frequencies equal to or higher than the carrier frequency and passes only the I component signal 54s from the quadrature mixer 54. As a result, the filter 55 generates a superimposed signal 55s in which the I signal component belonging to the baseband width and the DC offset component are superimposed.

The offset adder 56 is designed to cancel out unnecessary DC offset components, and is constructed of, e.g., an analog adder that applies a variable DC voltage through a resistor. The adder 56 generates an offset removed I signal (converted signal) 56s from which the superimposed DC offset component and the DC drifts derived from temperature changes at the next-stage buffer amplifier 57 have been cancelled out on the basis of an offset amount control signal 56c from the control section 500.

The buffer amplifier 57 receives the offset removed I signal 56s and generates a buffered I signal 100s, which is an in-phase component. Note that the buffer amplifier 57 may be eliminated from the construction according to this embodiment, if so desired.

The above applies similarly to the Q-side quadrature conversion section 200 that detects the Q signal, which is the other one of the quadrature signals. However, as shown in FIG. 7, having inserted the 90-degree phase shifter 42 between the reference oscillator 40 and the Q-side quadrature conversion section 200, quadrature synchronous detection is performed with a carrier frequency obtained by shifting the phase of the local frequency signal LF1 by 90 degree. As a result, the Q-side quadrature conversion section 200 generates from its output terminal a Q signal 200s, which is the quadrature component.

The variable phase shifters 101, 201 and 301 are variable delay units that finely adjust as desired the propagation time of local frequency signals LF, which are carrier signals of the passing basebands, in response to a control signal from the control section 500.

The selector switch 44, in response to a control signal from the control section 500, supplies to the mixer 46 and the variable phase shifter 301 a local frequency signal LF2, which is either the local frequency signal LF1 or a signal obtained by accurately shifting 90 degree the local frequency signal LF1 with the 90 degree phase shifter 41.

The M-sequence generation section 62 is a pattern generator generating long cycle pseudo random pulse trains, such as a PRBS (Pseudo Random Binary Sequence). The section 62 supplies an M-sequence pseudo random pulse signal 62s to the mixer 46 and the variable phase shifter 64. While the M-sequence cycle time is known, due to lack in flat randomness, it is desirable that measurements be made on the basis of an integral multiple of the cycle time.

The mixer 46 modulates the pseudo random pulse signal 62s from the M-sequence generation section 62 to an intermediate frequency baseband to supply an output, which is a PN signal 46s, to the selector switch 36 and the attenuator 34.

In response to the PN signal 46s, the attenuator 34 attenuates the signal level to such a feeble level as not to affect the received signal in practical terms, e.g., to a noise level (floor noise) and supplies the attenuated signal to the adder 32.

The adder 32 generates a superimposed IF signal 32s obtained by superimposing the feeble signal from the attenuator 34 on the main portion of the intermediate frequency signal IF from the frequency conversion section 10. Through this operation, the received signal supplied from an external device, even though superimposed, can be normally quadrature-detected and supplied to the succeeding circuit 90. That is, the superimposition does not affect the quadrature detection of the received signal.

In response to a control signal from the control section 500, the selector switch 36 selects the superimposed IF signal 32s or the PN signal 46s and supplies the selected signal to the reference quadrature conversion section 300.

In response to a control signal from the control section 500, the selector switch 38 then selects the I signal (converted signal) 100s from the I-side quadrature conversion section 100 or the Q signal from the Q-side quadrature conversion section 200, and supplies a selected IQ signal 38s to the other multiplier 72 via the detector calibration section 66. A path through which the selected IQ signal 38s is supplied to the multiplier 72 will hereinafter be called "IQ side" and a path extending from the output terminal of the reference quadrature conversion section 300 to the multiplier 72 will hereinafter be called "R side."

The selector switch 63 selects, in response to a control signal from the control section 500, the pseudo random pulse signal 62s from the M-sequence generation section 62 or a predetermined "Hi" level signal and supplies the selected signal to the variable phase shifter 64.

The variable phase shifter 64 is a variable delay unit that, in response to a control signal from the control section 500, receives either the pseudo random pulse signal 62s or the "Hi" level signal from the selector switch 63, finely adjusts the propagation time of the received signal in a desired way to generate a delayed random pulse signal 64s, which is supplied to both the multipliers 71 and 72.

The detector calibration section 66 is comprised of a selector switch and a reference voltage source for calibrating measurement systems, and chiefly designed to calibrate temperature deviations at the multipliers 71 and 72. The section 66 has a selector switch for selecting the calibration function and a reference voltage Vref and a zero voltage Vzero for calibration, and supplies the calibration reference voltage Vref or the zero voltage Vzero to the input terminals of both multipliers during calibration.

Each of the first and second multipliers 71 and 72 is a multiplier that multiplies two signals to provide an output. Receiving the delayed random pulse signal 64s at one of their input terminals, the multipliers 71 and 72 receive the detected signal 300s and the selected IQ signal 38s at the respectively corresponding other input terminals, and supplies signals obtained by multiplying the signal 64s with the signals 300s and 38s to the respectively corresponding first and second integration section 81 and 82.

The integration section 81 and 82 receive the multiplied signals and supply the analog integrated voltage signals obtained by integrating the received multiplied signals to the ADC section 80, respectively.

Figure 9:
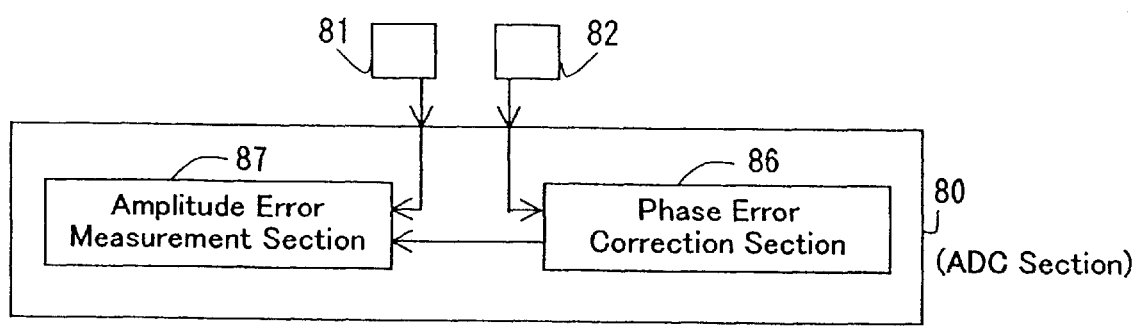
FIG. 9 is a block diagram showing the internal construction of an ADC section 80.

The ADC section 80 has two sets of circuitry each consisting of an AD converter and a buffer memory. In response to a control signal from the control section 500, the section 80 receives two analog integrated voltage signals at its input terminals, samples them at every predetermined time interval, converts the sampled data into digital data with its A/D converters, and sequentially stores the converted measured data to its internal buffer memories, respectively. The internal construction of the ADC section 80 is shown in FIG. 9. The phase error correction section 86 corrects a phase error in response to the signal received from the integration section 82, and the amplitude error measurement section 87 corrects an amplitude error in response to the signals received from the integration section 81 and 82. Note that the average calculation section 88 obtains an average of the selected IQ signals 38s.

The control section 500 is, e.g., a central processing unit (CPU), and continuously performs, whenever necessary, control over adjustment for the quadrature detection of the present invention concurrently with the receiving operation in order to ensure that a received signal can be normally quadrature-detected into I and Q signals. The major controlled elements according to the invention include the selector switches 44, 36, 38 and 63, the detector calibration section 66, the variable phase shifters 101, 201, 301 and 64, and the variable delay unit 52, the variable attenuator 53 and the offset adder 56 within each of the quadrature conversion sections 100, 200 and 300.

Next, the operation of the second embodiment will be described using the flowchart of FIG. 10. Note that the I- and Q-side quadrature conversion sections 100 and 200 are supposed to be continuously receiving signals, respectively. However, the sections 100 and 200 must maintain the best receiving conditions at all times against changes over time, such as temperature changes inside the apparatus and ambient temperature changes. Particularly, semiconductor characteristics, such as propagation delay amount and degree of amplification, are largely variable with temperature changes.

In the correction control according to the present invention, the I- and Q-side variable phase shifters 101 and 201, and the variable attenuators 53 and the offset adders 56 incorporated in the quadrature conversion sections 100 and 200 make only slight corrections on the basis of their finally obtained correction amounts except at the outset. This is why a received signal can be quadrature-detected continuously without affecting the receiving operation.

Figure 10A:
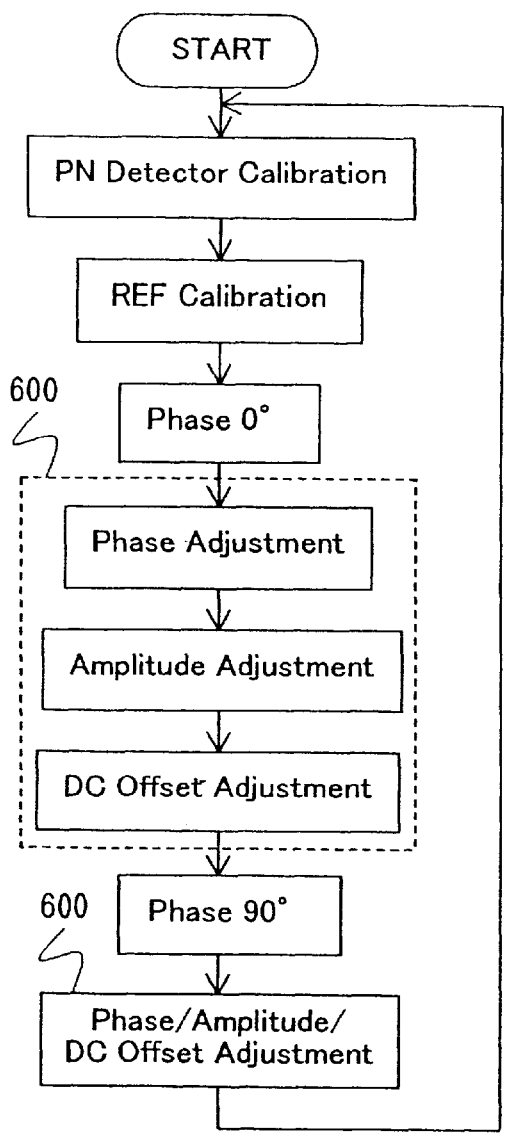
FIG. 10 is a flowchart showing the operation of the second embodiment.

As shown in FIG. 10(a), the whole process consists of a repetitive loop including a PN detector calibration step, a REF calibration step, a phase 0 degree step, a delay adjustment step, a phase adjustment step, an amplitude adjustment step, a DC offset adjustment step, a phase 90 degree step, and a delay/phase/amplitude/DC offset adjustment step 600. These measurement controls are carried out by the control section 500. Here, the delay/phase/amplitude/DC offset adjustment step 600 consists of the same processing content as the delay adjustment step, the phase adjustment step, the amplitude adjustment step, and the DC offset adjustment step.

First of all, in the "PN DETECTOR CALIBRATION" step shown in FIG. 10(a), calibration is performed to two measurement systems, one for the additional R side and the other for the IQ side. That is, the calibration process starts when the detector calibration section 66 is set to the calibration side and the selector switch 63 thereafter supplies the specified "Hi" level signal to the corresponding input terminals of both multipliers 71 and 72. First, the zero voltage Vzero is applied to the other input terminals of both multipliers 71 and 72, and the ADC section 80 measures it and stores the measured data as R- and IQ-side zero voltage offsets, respectively. Second, the calibration reference voltage Vref is then supplied to the other input terminals of both multipliers 71 and 72, the ADC section 80 measures it and stores, for use as calibrated values of the calibration reference voltages Vref, values obtained by subtracting from the R- and IQ-side measured data the corresponding R- and IQ-side zero voltage offsets, respectively.

Through the above operation, the two R- and IQ-side measurement systems have been calibrated with respect to the current temperature inside the apparatus.

Figure 10B:
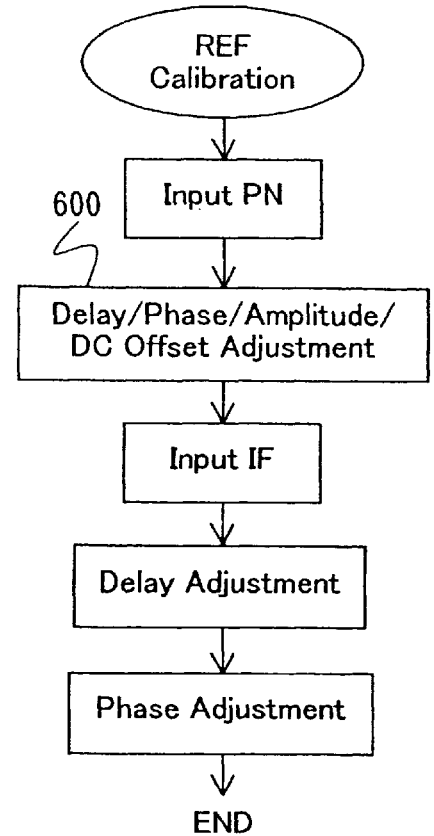

Next, in the "REF CALIBRATION" step shown in FIG. 10(a), the reference quadrature conversion section 300 is set to a reference state. FIG. 10(b) shows details of this processing step. Through this processing step, the variable phase shifter 301, the variable delay unit 52, the variable attenuator 53 and the offset adder 56 within the reference quadrature conversion section 300 are set to their reference states.

First, in the "INPUT PN" step, the selector switch 36 is switched to the a-side to supply the PN signal 46s to the reference quadrature conversion section 300.

Next, in the "DELAY/PHASE/AMPLITUDE/DC OFFSET ADJUSTMENT" step 600 consists of delay adjustment, phase adjustment, amplitude adjustment, and DC offset adjustment. These four adjustment steps will be described below individually.

Figure 11:
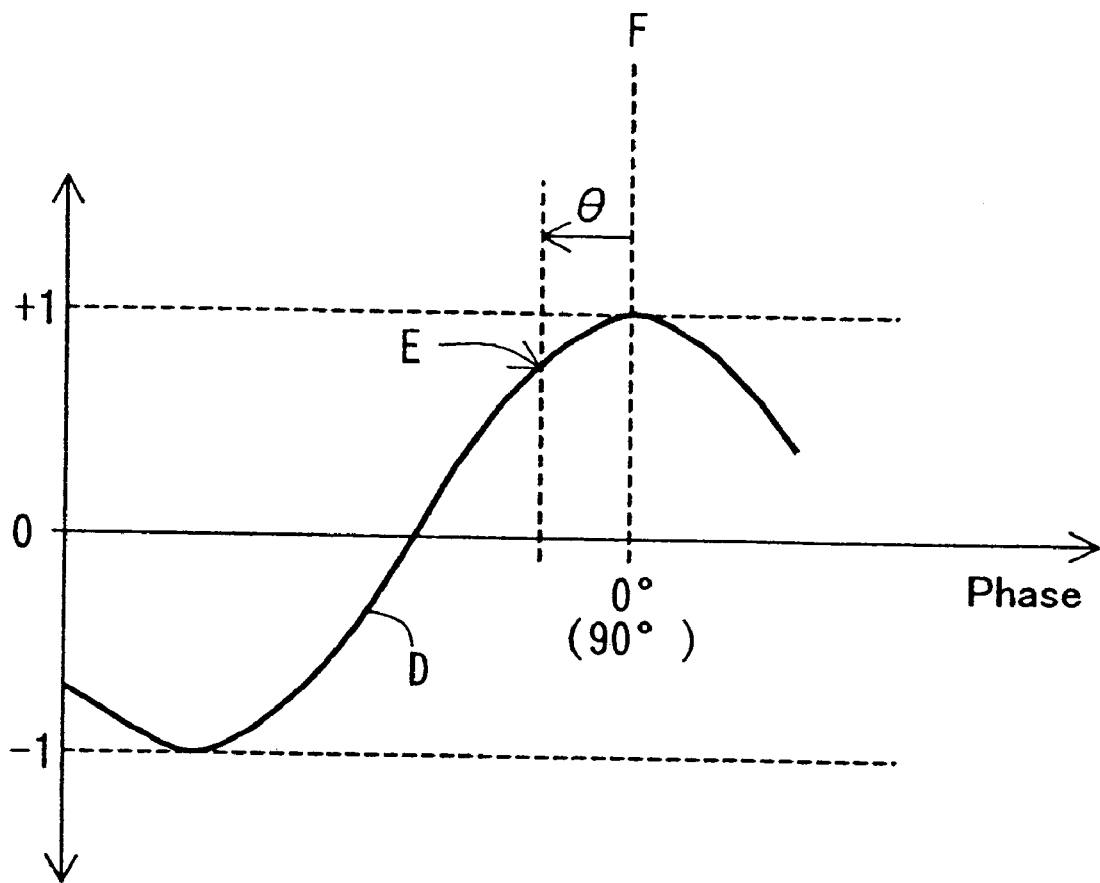
FIG. 11 is a diagram illustrating the principle of detecting a phase error and for specifying an in-phase position from a plot of measured data.

In the first step of delay adjustment, the PN signal is received as an input, and measurements are made sequentially by changing the delay amount of the variable delay unit 52 (see FIG. 8) within the reference quadrature conversion section 300, e.g., at every single cycle time of the M-sequence generation section. That is, the detected signal 300s from the reference quadrature conversion section 300 is multiplied with the delayed random pulse signal 64s from the variable phase shifter 64 by the multiplier 71, and the multiplied signal is integrated by a predetermined time constant to obtain a DC signal. Then this DC signal is converted to a digital signal. The thus obtained digital measured data are sequentially stored in the memory. An exemplary plot of such measured data is shown in FIG. 11. FIG. 11D depicts the plot of the measured data. A position indicating the maximum value in absolute terms (see FIG. 11F) is determined as a reference position to which the delay amount should be adjusted. The value indicating the reference position for delay adjustment is stored, and the variable delay unit 52 is updated accordingly. Note that the above data gathering method in which measurements are made by increasing the delay amount of the variable delay unit 52 by every predetermined unit amount entails much time due to an increased measurement frequency. Since what is important in this adjustment step is to obtain the maximum value, the above method may be replaced with a bit search technique in which discrete search is made only in the direction of increasing the measured values. A specific example of such a technique is a binary search method in which a search segment is halved. In such a case, the measurement frequency can be drastically curtailed, and thus the adjustment can be completed quickly.

In the second step of phase adjustment, the PN signal is received as an input, and measurements are made sequentially by changing the phase shifting amount of the variable phase shifter 301 to be supplied to the reference quadrature conversion section 300, and the measured data are similarly stored in the memory sequentially. From among the obtained measured data, a position indicating the maximum value in absolute terms is determined as a reference position to which the phase shifting amount should be adjusted. The value indicating the reference position for phase adjustment is stored, and the variable phase shifter 301 is updated accordingly. The phase adjustment is thus complete.

In the third step of amplitude adjustment, the PN signal is received as an input, the attenuation amount of the variable attenuator 53 within the reference quadrature conversion section 300 is controlled in such a way that every piece of measured data to be obtained will have a prescribed amplitude. That is, measured data are obtained by changing the attenuation amount of the variable attenuator 53, and an attenuation amount with which the obtained piece of measured data exhibited the prescribed amplitude is stored, and further the attenuation amount of the variable attenator 53 is updated accordingly. The amplitude adjustment is thus complete.

In the fourth step of DC offset adjustment, a PN signal obtained with the operation of the M-sequence generation section 62 interrupted, i.e., no signal is received as an input, and the offset amount of the offset adder 56 within the reference quadrature conversion section 300 is controlled in such a way that every piece of measured data will have a zero offset. That is, an offset control value with which an obtained piece of measured data exhibited zero is stored, and the offset control value of the offset adder 56 is updated accordingly. The DC offset adjustment is thus complete.

Next, in the "INPUT IF" step, the selector switch 36 is set to the b side to supply the superimposed IF signal 32s to the reference quadrature conversion section 300. This superimposed IF signal 32s contains an extremely feeble superimposed PN signal, and adjustment is made using this feeble PN signal.

Next, in the "DELAY ADJUSTMENT" step, the superimposed IF signal 32s is received as an input signal to be adjusted, measurements are made by sequentially changing the delay amount of the variable delay unit 52 within the reference quadrature conversion section 300 at every unit time defined as, e.g., plural cycle times with respect to a single cycle time of the M-sequence generation section. This long unit time is required because it takes time to clearly detect the extremely feeble PN signal contained in the superimposed IF signal 32s.

Now, the detection of a feeble PN signal and its synchronization relationship will be descried with reference to FIG.

Figure 12A:
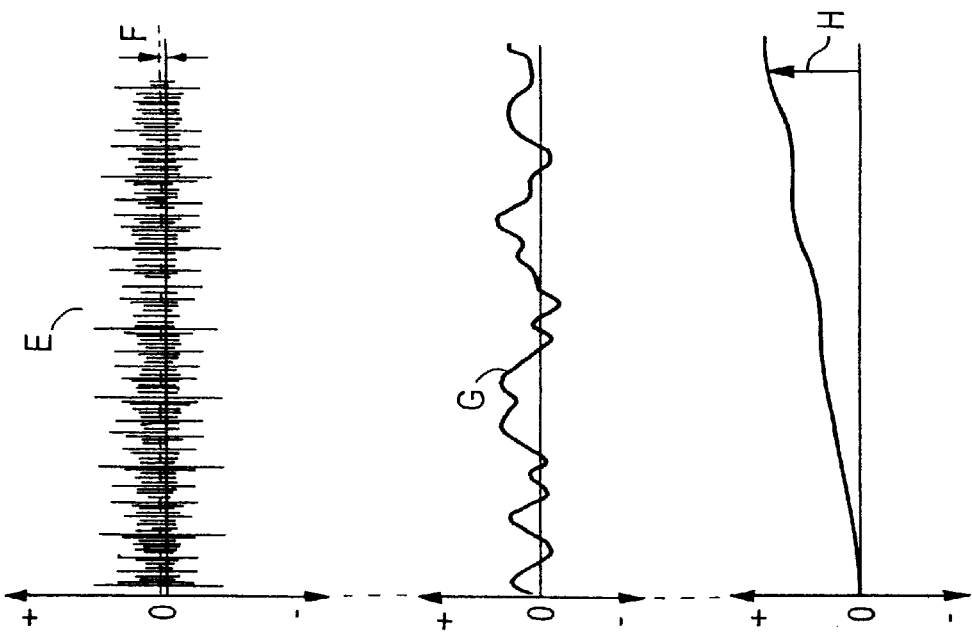
FIG. 12 is a diagram illustrating detection of a feeble PN signal and its synchronization relationship.
Figure 12B:
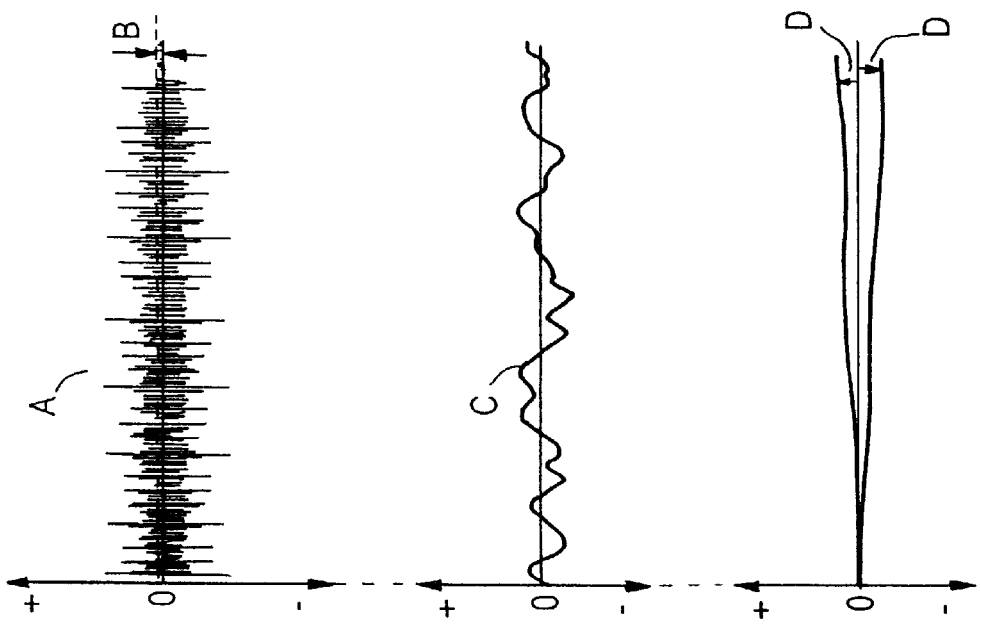

12. The multiplied output signal from the multiplier 71 consists mainly of an unknown amplitude component derived from the received signal, and such a component fluctuates largely to both positive and negative sides (see FIGS. 12A and 12E). However, its average, although exhibiting an undefinable random state, stays close to zero (see FIGS. 12C and 12G). Further, when this component is integrated over a desired long period, a DC component having a substantially constant ramp is obtained (see FIGS. 12D and 12H). A large DC component (see FIG. 12H) is obtained in the case of FIG. 12(b) in which the amplitude component is multiplied with the M-sequence random pattern in a synchronization relationship, while a small DC component (see FIG. 12D) is obtained in the case of FIG. 12(a) in which they are multiplied in a nonsynchronization relationship. Using this characteristic action, the position where the received signal synchronizes and whether the received signal is in a state close to synchronization can be detected. That is, when the multiplication is performed in synchronism, a large dc component is obtained with the feeble PN signal showing up as a detected signal, and in contrast, when the multiplication is performed out of synchronism, a small dc component is obtained. Further, although an amplitude swaying largely to both positive and negative sides is generated from an unknown input signal, when such an input signal is integrated, it becomes almost zero since it is nonsynchronized with the feeble PN signal.

In the delay adjustment step, using the above-mentioned characteristic detecting action, measurements are made by changing the delay amount of the variable delay unit 52 (or by using the binary search technique). Each measurement is given a long duration. Signals obtained by integrating the measured data over such a duration are sequentially stored in the memory after converted into digital signals similarly to the above. Through these measurements, phase deviations are measured by detecting the feeble PN signal, and a position indicating the maximum value in absolute terms among these measured data is obtained as a reference position to which the PN signal should be adjusted. The value indicating this adjustment position is stored, and the variable delay unit 52 is then updated accordingly. The delay adjustment is thus complete.

Next, in the "PHASE ADJUSTMENT" step, the superimposed IF signal 32s is received as an input signal to be adjusted, and measurements are made sequentially by changing the phase shifting amount of the variable phase shifter 301 to be supplied to the reference quadrature conversion section 300 similarly on a long duration basis. At this time, the measurements are made by alternately switching the phase of the reference oscillator 40 between 0 degree and 90 degree. Among the thus obtained measured data, a position indicating the maximum value in absolute terms at the time the phase of the reference oscillator 40 is 0 degree is a reference position to which the phase error of the signal 32s should be adjusted, and a position indicating the minimum value in absolute terms at the time the phase of the reference oscillator 40 is 90 degree is also the reference position to which the phase error should be adjusted. Thus, the adjustment position can be obtained accurately through both measurements. The value indicating the adjustment position is stored, and the variable phase shifter 301 is then updated accordingly. The phase adjustment is thus complete.

The reference quadrature conversion section 300 has been calibrated to be a standard with respect to the current temperature inside the apparatus through the above adjustments.

Next, in the "PHASE 0 degree" step shown in FIG. 10(a), the I-side quadrature conversion section 100 is adjusted. To make this adjustment, switching is made so that the reference quadrature conversion section 300 is in phase with the I-side quadrature conversion section 100. That is, the selector switch 44 is switched to the b side to use the local frequency signal LF1. Further, the selector switch 36 is switched to the b side so that the reference quadrature conversion section 300 receives the same superimposed IF signal 32s as the I-side quadrature conversion section 100. Further, to connect the measurement system to the I-side quadrature conversion section 100, the selector switch 38 is switched to the a-side to supply the I signal 100s to the multiplier 72.

By the way, the I-side quadrature conversion section 100 and the Q-side quadrature conversion section 200 are continuously receiving signals. For this reason, their adjustment requires a technique other than the above-mentioned search method applied to the adjustment of the reference quadrature conversion section 300 in which measurements are made by sequentially changing the adjustment amount of each element to be adjusted.

Thus, the I- and Q-side quadrature conversion sections 100 and 200 must be calibrated while continuously performing their receiving operation. However, the calibration procedure is similar to that of the first embodiment.

Note that the section constituting the present invention is not limited to the above-mentioned embodiments. For example, the present invention can be embodied by an apparatus having no frequency conversion section 10 shown in FIG. 1. Further, the reference oscillator 40 may be a PLL local oscillator that, in response to an intermediate frequency signal IF, oscillates in synchronism with the phase of this carrier wave.

Further, with respect to the cycle time of the M-sequence generation section 62 and that of a received signal, the M-sequence generation section 62 may, in some rare case, have a substantially coincident cycle time relationship or have a substantially synchronous cycle time relationship with a received signal, depending on a received signal applied. This may cause variations in measured data or measurement errors, which in turn causes such inconvenience that the correction operation does not converge within an expected converging time. To handle received signals that are likely to cause this inconvenience, there should be provided means for generating pseudo random pulse trains of two different cycle times. For example, the number of code sequence generating cycles is changed, or different cycle times are generated by changing the frequency of a clock source to be used. Using such means, the problem of prolonged operation can be easily solved by selecting other cycle times.

Further, while the case where correction control covering all the four items, i.e., phase, delay, amplitude and DC offset, is performed in response to a quadrature signal has been described above as a specific example, the present invention may be embodied to correct at least one of the above four correction items. For example, phase errors may be corrected, or amplitude error or DC offset errors may be corrected.

Further, while the multipliers 71 and 72 are provided to construct two measurement systems, the same advantage can be obtained by only one measurement system with a switching function. Further, the M-sequence generation section 62 may be replaced with other types of random sequence generation means.

Third Embodiment

Figure 13:
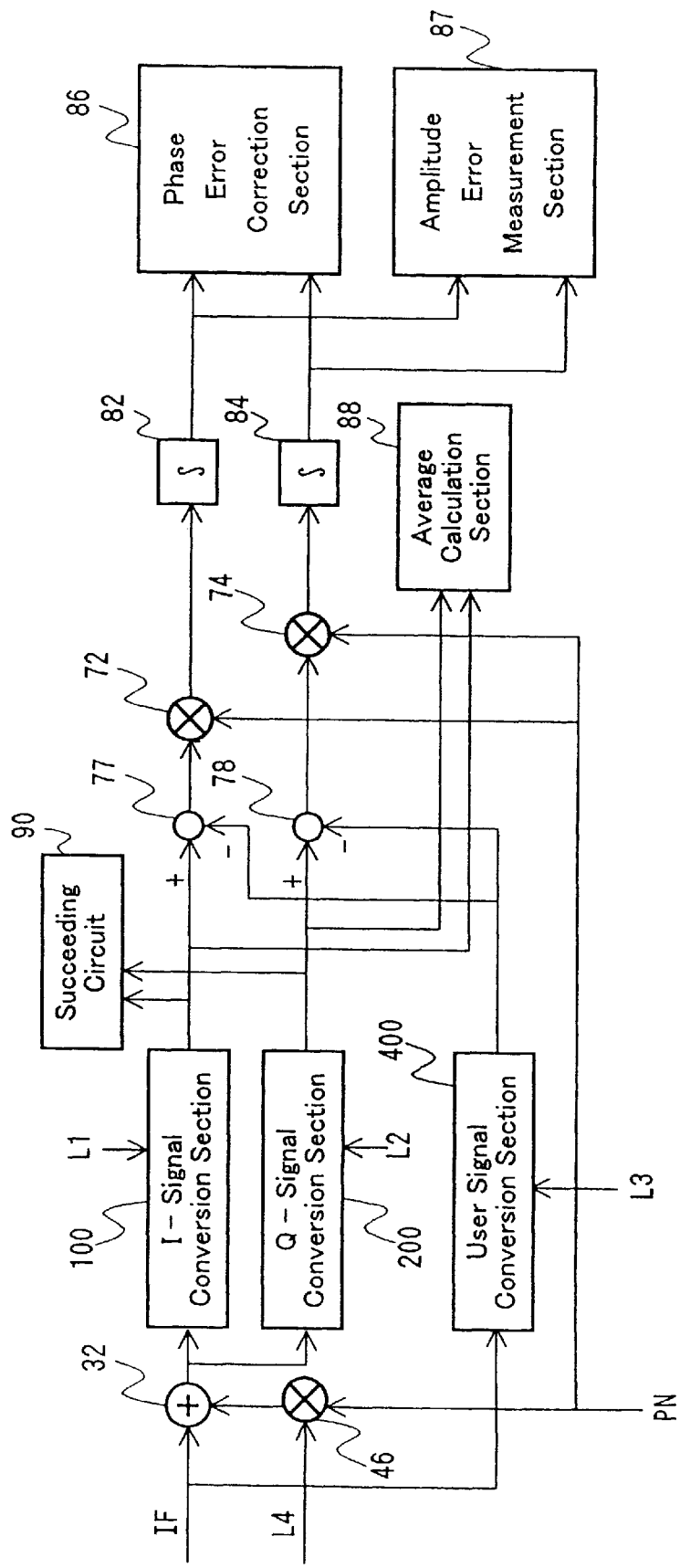
FIG. 13 is a block diagram showing the construction of a quadrature demodulator according to a third embodiment.

A quadrature demodulator according to a third embodiment is distinguished from the first embodiment in that a user signal in a converted signal is removed by a user signal conversion section 400. Parts and components similar to those of the first embodiment are denoted by the same reference numerals and their description will be omitted. The construction of the quadrature demodulator according to the third embodiment is shown in FIG. 13.

The user signal conversion section 400 has a similar construction to that of an I signal conversion section 100 except that the section 400 generates a converted user signal obtained by mixing a local signal L3 with a user signal. What is important here is that it is a user signal, not a pseudo noise superimposed signal that is mixed.

A subtractor 77 subtracts the converted user signal, which is an output of the user signal conversion section 400, from an output of the I signal conversion section 100. A quadrature subtractor 78 subtracts the converted user signal, which is the output of the user signal conversion section 400, from an output of a Q signal conversion section 200. The differences obtained by the subtractor 77 and the quadrature subtractor 78 are fed to a first multiplier 72 and a quadrature multiplier 74 to be multiplied with a pseudo noise, respectively.

Figure 14:
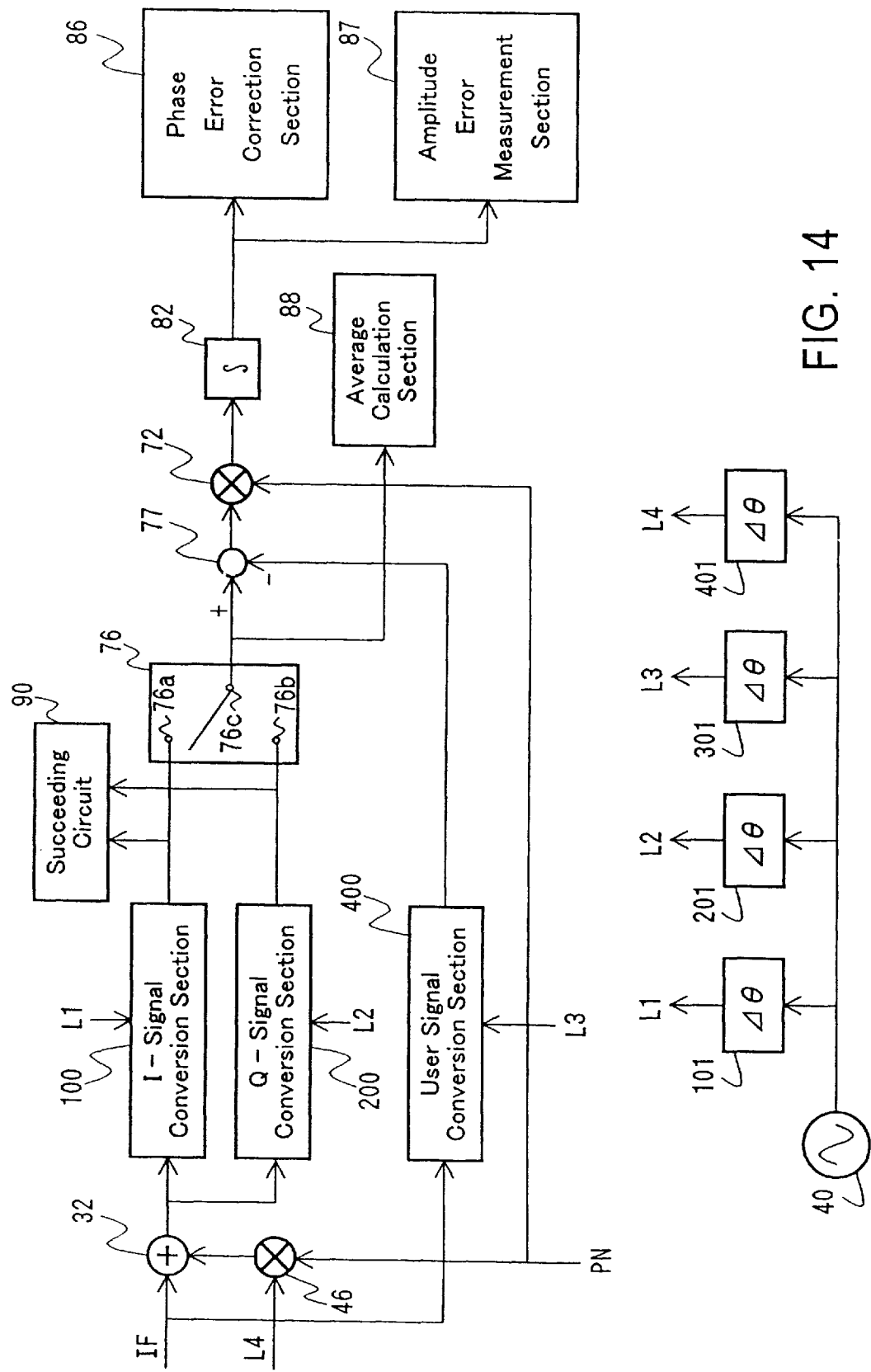
FIG. 14 is a diagram showing the construction including a selector switch 76.

Note that the quadrature subtractor 78 may be incorporated into the subtractor 77, the quadrature multiplier 74 into the first multiplier 72, and a quadrature integrator 84 into a first integrator 82. The thus modified construction is shown in FIG. 14. That is, a selector switch 76 is provided so as to switch the connection of a terminal 76c on the subtractor 77 side is switched between a terminal 76a on the I signal conversion section 100 side and a terminal 76b on the Q signal conversion section 200 side.

Further, an ALC (automatic level controller) may be inserted between an adder 32 and a pseudo noise mixer/multiplier 46. This arrangement is applicable to both constructions of FIGS. 13 and 14.

Next, the operation of the third embodiment of the present invention will be described. Its operation procedure will be described with reference to FIG. 4 since it is substantially the same as that shown in FIG. 4. However, calibration of the reference signal conversion section (S10) is not carried out since a reference signal conversion section 300 is not provided in the third embodiment.

First, the phase error of the I signal conversion section 100 is calibrated (S12). A converted signal from the I signal conversion section 100 is expressed as equation (1) of FIG. 5, and a converted user signal, which is the output of the user signal conversion section 400, is expressed as equation (1') of FIG. 15, which is obtained by eliminating the P(t) term from equation (1) of FIG. 5. Hence, when the converted user signal is subtracted from the converted signal by the subtractor 77, maP(t)cos θ is obtained. Then the phase error of the I signal conversion section 100 is calibrated in a way similar to that of the first embodiment.

However, unlike in the first embodiment, a user signal component is not supplied to the first multiplier 72. The first multiplier 72 in the first embodiment receives a converted signal containing a relatively large user signal and a relatively small pseudo noise, and hence, when the converted signal is multiplied with the pseudo noise, the user signal tends to affect the multiplication. However, in the third embodiment, in which no user signal component is supplied to the first multiplier 72, the phase error of the I signal conversion section 100 can be calibrated with a higher degree of accuracy.

Note that the phase error of the Q signal conversion section 200 can be similarly calibrated.

Next, the amplitude error of the I signal conversion section 100 is calibrated (S14). An amplitude error measurement section 87 obtains an amplitude error m by dividing an output mag of the first integrator 82 by an output ag of the first integrator 82 that would be obtained if there were no amplitude and phase errors. Note that the value ag, which could be a specified value if the multiplier, the ALC and the like are adequately calibrated, is predictable. Further, the amplitude error can be corrected in a way similar to that of the first embodiment.

Note that the amplitude error of the Q signal conversion section 200 can be similarly calibrated.

Finally, the DC offset error of the I signal conversion section 100 is calibrated (S16). A procedure similar to that in the first embodiment is followed.

According to the third embodiment of the present invention, similarly to the first embodiment, a succeeding circuit 90 can process the converted signal and the quadrature converted signal in a desired way while phase, amplitude and DC offset errors of the I and Q signal conversion sections 100 and 200 are being calibrated.

Additionally, no user signal component is supplied to the first integrator 72, and thus the sections 100 and 200 can be calibrated with a higher degree of accuracy than in the first embodiment.

Fourth Embodiment

Figure 16:
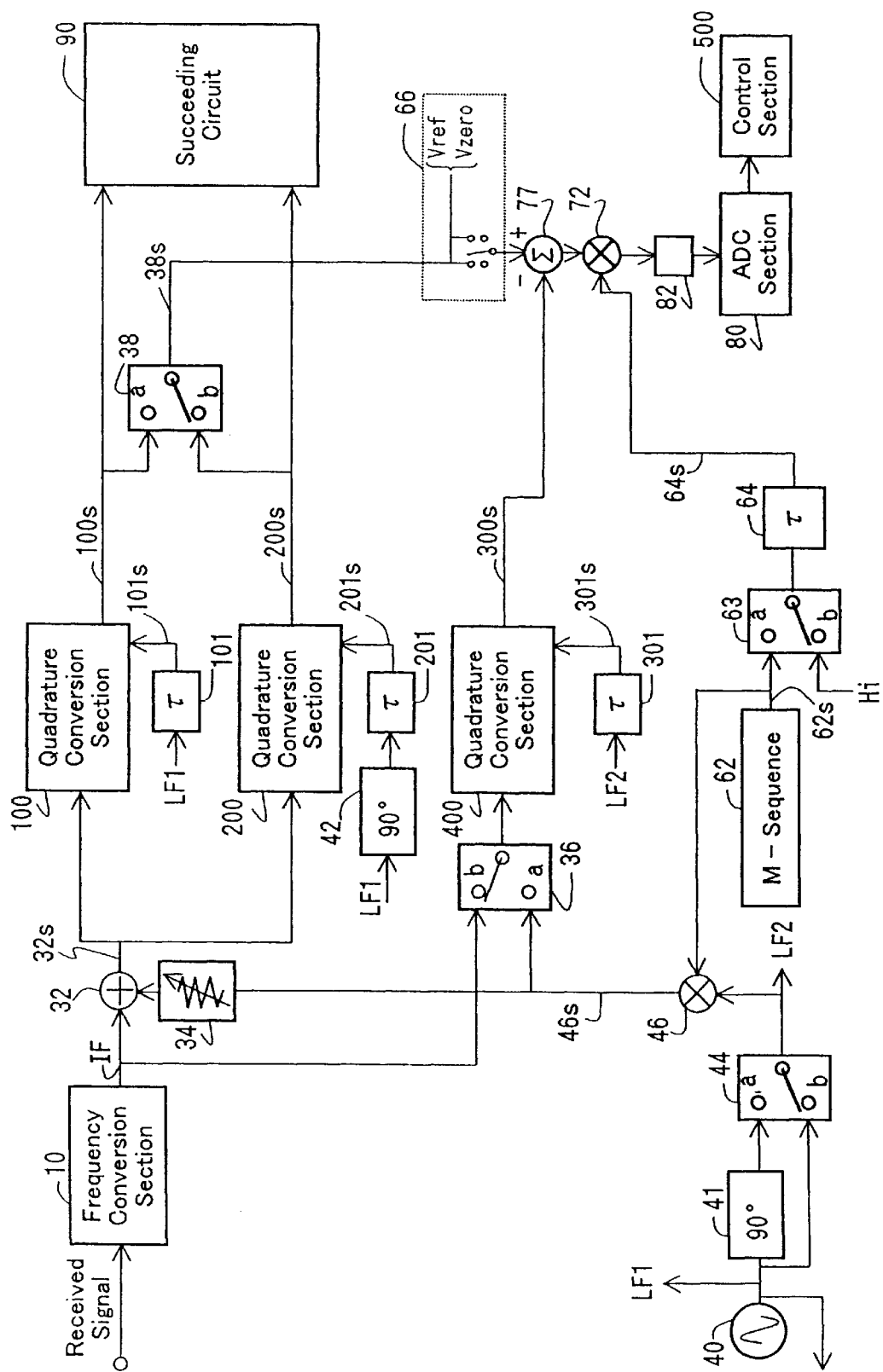
FIG. 16 is a block diagram showing the construction of a quadrature demodulator according to a fourth embodiment.

A fourth embodiment is obtained by further materializing the construction of the third embodiment. FIG. 16 is a block diagram showing the construction of the fourth embodiment. Since its construction is substantially the same as that of the second embodiment, the same parts and components are denoted by the same reference numerals and their description will be omitted.

In response to a control signal from a control section 500, a selector switch 36 selects either an IF signal or a PN signal 46s and supplies the selected signal.

A subtractor 77 subtracts a detected signal 300s, which is an output of a user signal conversion section 400, from a selected IQ signal 38s.

A multiplier 72 multiplies the output of the subtractor 77 with a delayed random pulse signal 64s and outputs the multiplied signal.

Figure 17:
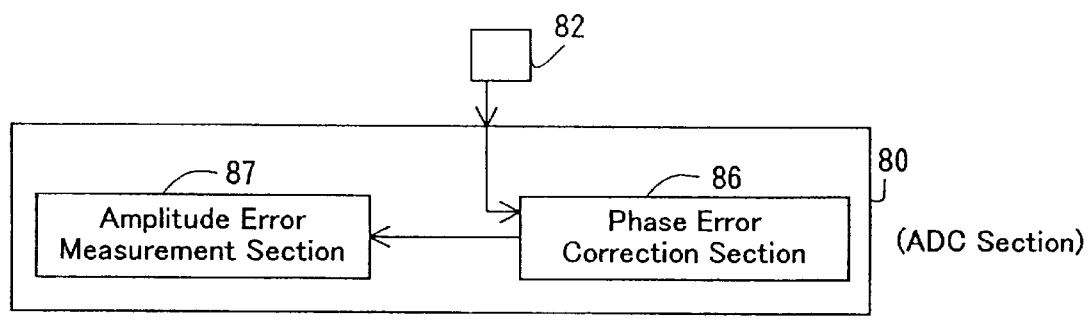
FIG. 17 is a block diagram showing the internal construction of an ADC section 80.

The internal construction of an ADC section 80 is shown in FIG. 17. A phase error correction section 86 and an amplitude error measurement section 87 receive a signal from integration section 82 and correct phase and amplitude errors, respectively. Note that an average calculation section 88 obtains an average of the selected IQ signals 38s.

Note that the operation of the fourth embodiment is similar to those of the first and third embodiments.

Fifth Embodiment

Figure 18:
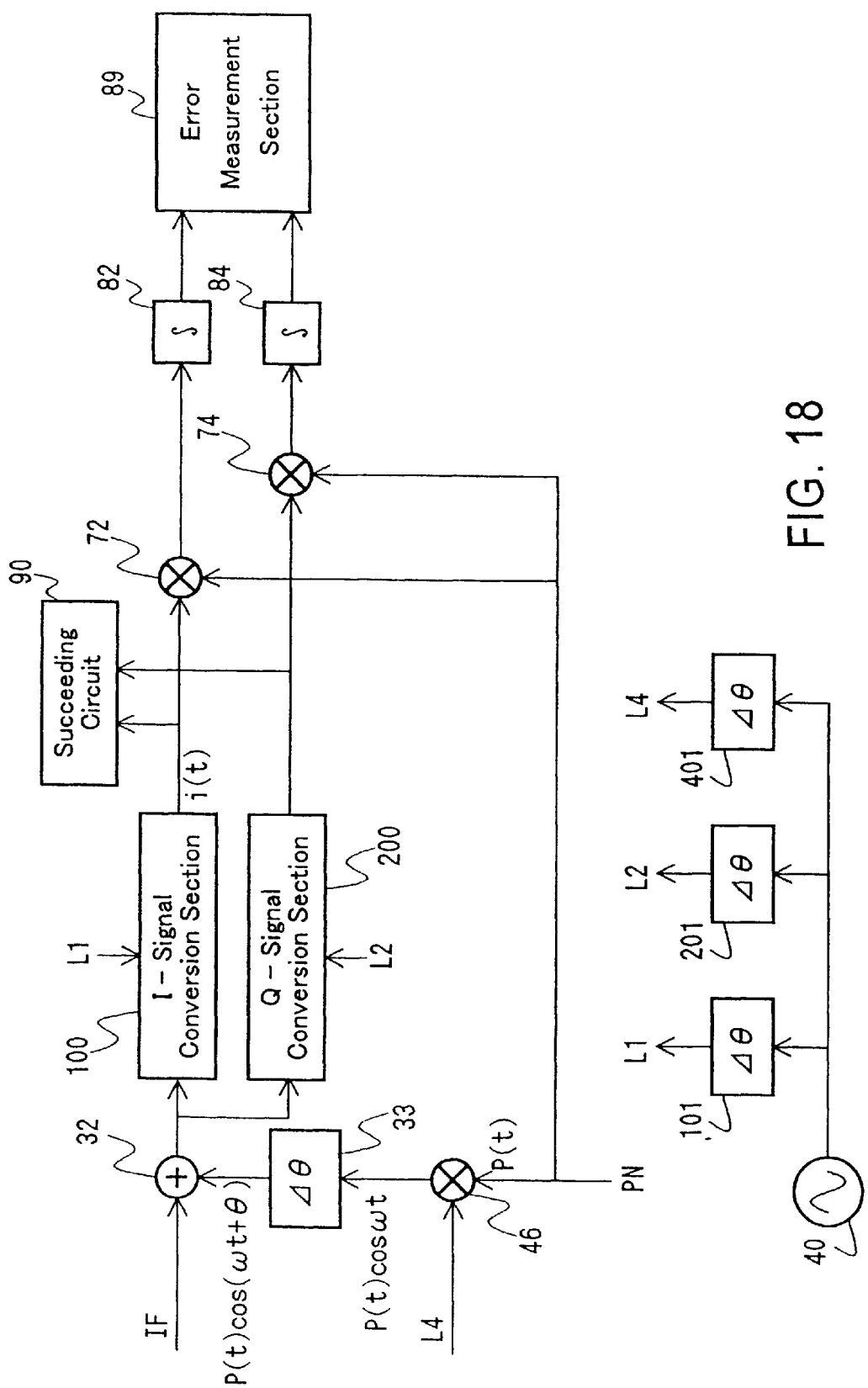
FIG. 18 is a block diagram showing the construction of a quadrature demodulator according to a fifth embodiment.

A quadrature demodulator according to the fifth embodiment is distinguished from that of the first embodiment in that the former performs calibration on the basis of a graph obtained with the horizontal and vertical axes indicating the products and integrals of the outputs of I and Q signal conversion sections 100 and 200. Parts and components similar to those of the first embodiment are denoted by the same reference numerals and their description will be omitted. The construction of the quadrature demodulator according to the fifth embodiment is shown in FIG. 18.

A phase shifter 33 changes the phase of an output of a pseudo noise mixer/multiplier 46. An error measurement section 89 measures errors on the basis of the results obtained with the horizontal axis indicating the outputs of an integrator 82 and the vertical axis indicating the outputs of a quadrature integrator 84. Note that the section 89 may also calibrate errors.

Figure 19:
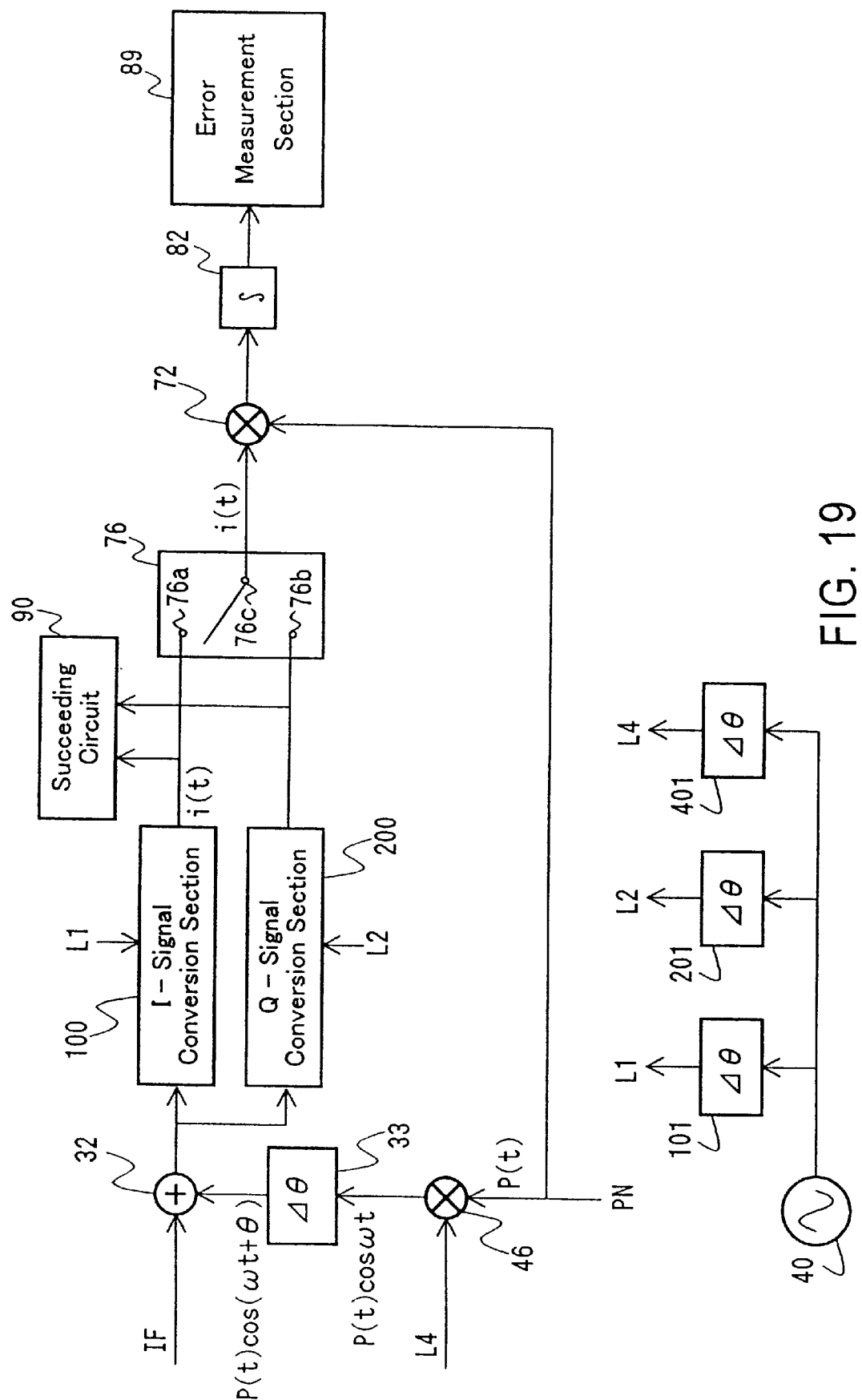
FIG. 19 is a diagram showing the construction including a selector switch 76.

Note also that a quadrature multiplier 74 may be incorporated into a multiplier 72 and the quadrature integrator 84 into the integrator 82. The thus modified construction is shown in FIG. 19. That is, a selector switch 76 is provided so as to switch the connection of a terminal 76c on the first multiplier 72 side between a terminal 76a on the I signal conversion section 100 side and a terminal 76b on the Q signal conversion section 200 side.

Next, the operation of the fifth embodiment of the present invention will be described. Note that θ indicates the amount of phase shifted by the phase shifter 33 and ψ indicates the phase error in the fifth and sixth embodiments.

A pseudo noise P(t) is mixed with a local signal L4 by the pseudo noise mixer/multiplier 46 to become a mixed signal P(t)cos ωt. Then, when the phase shifter 33 changes the phase of the mixed signal, an output P(t)cos(ωt+θ) is obtained. This is supplied to an adder 32.

The I signal conversion section 100 has a lowpass filter 55 that is also an integrating element. Hence, the P(t) component of a converted signal from the I signal converting section 100 is expressed as equation (8) of FIG. 20. The Q signal conversion section 200 also has the lowpass filter 55 that is also an integrating element. Hence, the P(t) component of a converted signal from the Q signal conversion section 200 is expressed as equation (9) of FIG. 20. Note that equation (9) is obtained by substituting cos ωt of equation (8) with sin ωt in order to have the phase of the output of the I signal conversion section 100 in quadrature with the phase of the output of the Q signal conversion section 200.

Let θ (the amount of phase shifted by the phase shifter 33) be 0 here. Then equation (8) is replaced with equation (10) and equation (9) with equation (11). Note that the interval of integration of the lowpass filter 55 is supposed to be sufficiently shorter than the cycle of P(t) and sufficiently longer than the cycle of cos ωt. That is, equation (8) gives the P(t) term of the signal from the I signal conversion section 100, and equation (11) gives the P(t) term of the signal from the Q signal conversion section 200. Since it is apparent from the first embodiment that only the P(t) terms in the outputs of the I and Q signal conversion sections 100 and 200 remain in the outputs of the first integrator 82 and the quadrature integrator 84, respectively, only the P(t) terms in the outputs of the I and Q signal conversion sections 100 and 200 will be considered.

When a signal expressed as equation (10) is multiplied and integrated, a constant (C) is obtained. When a signal expressed as equation (11) is multiplied and integrated, 0 is obtained, since the integral of a "sin" term is 0 if it is integrated in a sufficiently large interval. A graph shown in FIG. 21(a) (in the case of θ=0 degree) results with the horizontal axis indicating the outputs of the first integrator 82 and the vertical axis indicating the outputs of the quadrature integrator 84.

When θ=90 degree similarly, equation (8) is replaced with equation (12) and equation (9) with equation (13). When a signal expressed as equation (12) is multiplied and integrated, 0 is obtained, since the integral of a "sin" term is 0 when it is integrated in a sufficiently large interval. When a signal expressed as equation (13) is multiplied and integrated, C is obtained, since the integral of a "sin" term is equal to the integral of a "$\cos^2$" term when they are integrated in a sufficiently large interval. A graph shown in FIG. 21(a) (in the case of θ=90 degree) results with the horizontal axis indicating the outputs of the first integrator 82 and the vertical axis indicating the outputs of the quadrature integrator 84.

When θ=45 degree similarly, equation (8) is replaced with equation (14) and equation (9) with equation (15). When a signal expressed as equation (14) is multiplied and integrated, $C/\sqrt{2}$ is obtained, since the integral of a "sin" term is 0 when it is integrated in a sufficiently large interval. When a signal expressed as equation (15) is multiplied and integrated, $-C/\sqrt{2}$ is obtained. A graph shown in FIG. 21(a) results with the horizontal axis indicating the outputs of the first integrator 82 and the vertical axis indicating the outputs of the quadrature integrator 84.

Figure 21A:
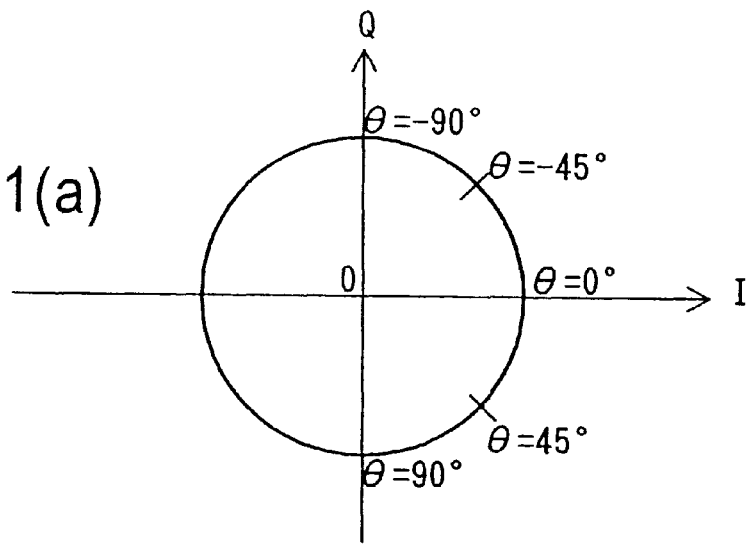
FIG. 21 is a diagram showing the operation of the fifth embodiment.
Figure 21B:
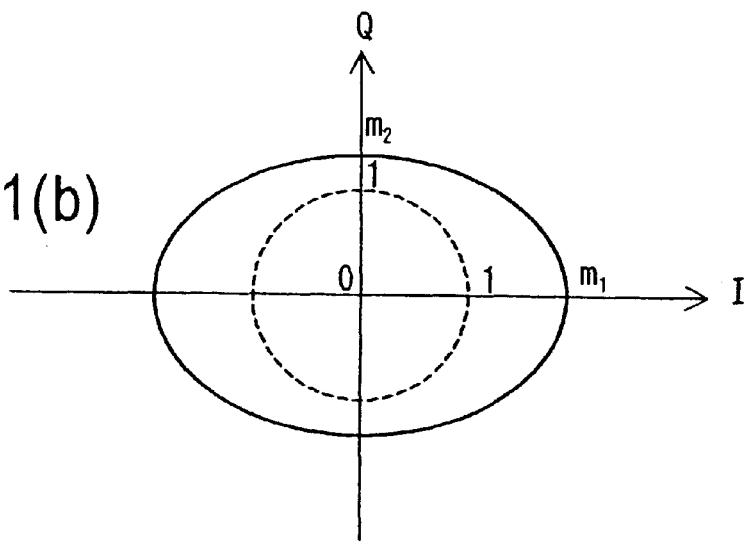
Figure 21C:
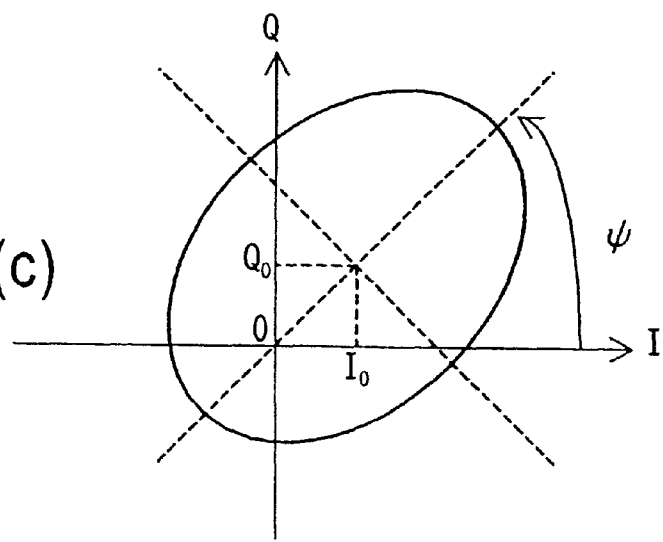

As described above, if no error is found in the I and Q signal conversion sections 100 and 200, a complete round such as shown in FIG. 21(a) results with the horizontal axis indicating the outputs of the first integrator 82 and the vertical axis indicating the outputs of the quadrature integrator 84. However, if an amplitude error m1 is found in the I signal conversion section 100 (the amplitude is multiplied by m1) and an amplitude error m2 is found in the Q signal conversion section 200 (the amplitude is multiplied by m2), then an ellipse such as shown in FIG. 21(b) results. Further, if a DC offset error I0 and a phase error ψ are found in the I signal conversion section 100 and a DC offset error Q0 is found in the Q signal conversion section 200, then an ellipse such as shown in FIG. 21(c) results. Hence, one can find DC offset, phase and amplitude errors by sequentially changing θ, and obtaining a graph with the horizontal axis indicating every instantaneous output of the first integrator 82 and the vertical axis indicating every instantaneous output of the quadrature integrator 84.

According to the fifth embodiment of the present invention, similarly to the first embodiment, a succeeding circuit 90 can process the converted signal and the quadrature converted signal in a desired way while phase, amplitude and DC offset errors of the I and Q signal conversion sections 100 and 200 are being calibrated.

Sixth Embodiment

Figure 22:
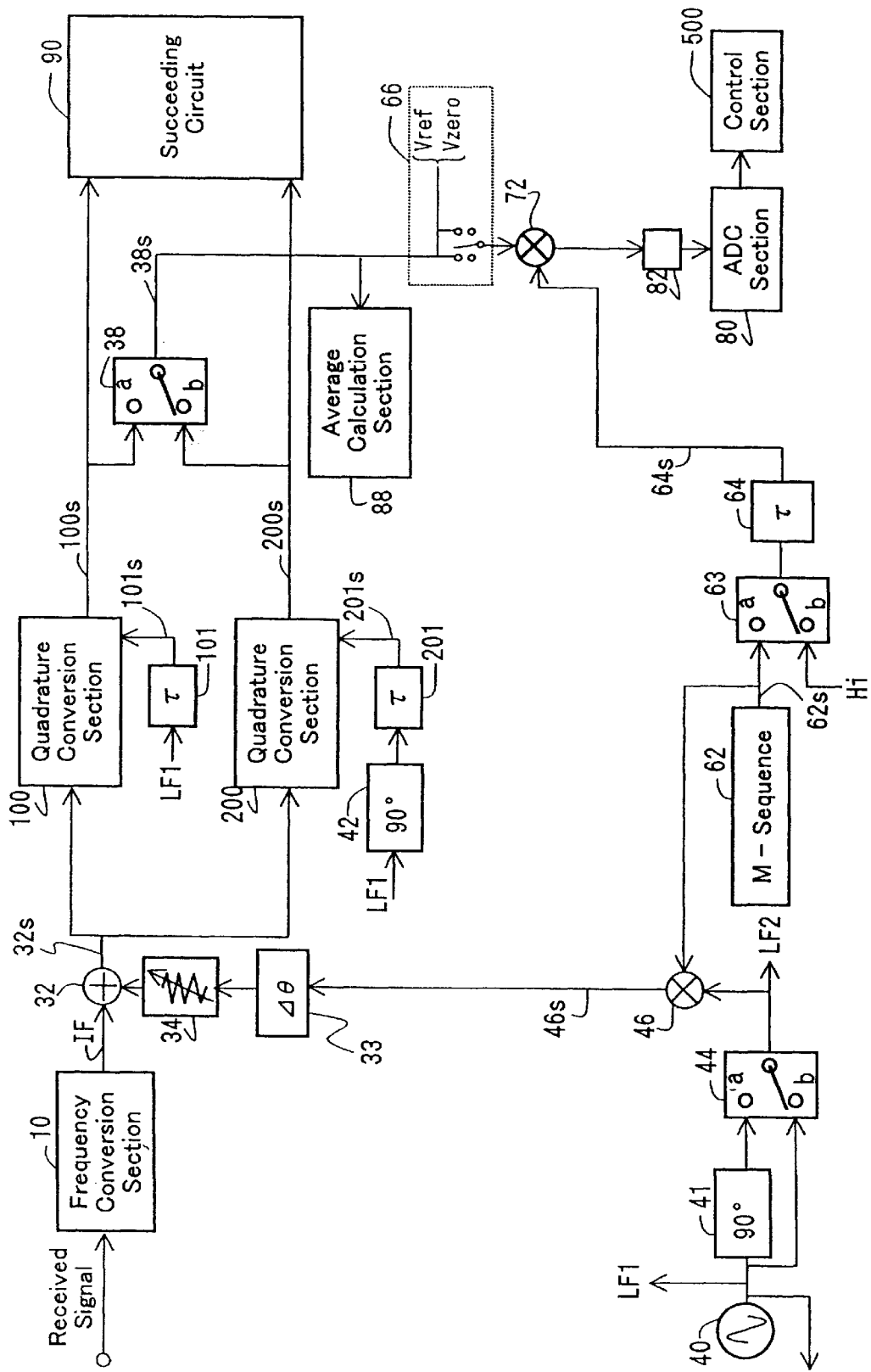
FIG. 22 is a block diagram showing the construction of a quadrature demodulator according to a sixth embodiment.

A sixth embodiment is obtained by further materializing the construction of the fifth embodiment. FIG. 22 is a block diagram showing the construction of the sixth embodiment.

A phase shifter 33 changes the phase of a PN signal 46s and generates the phase-shifted PN signal. An ADC section 80 calibrates phase, amplitude and DC offset errors on the basis of the outputs of an integration section 82.

Note that the operation of the sixth embodiment is similar to those of the second and fifth embodiments.

Seventh Embodiment

Figure 23:
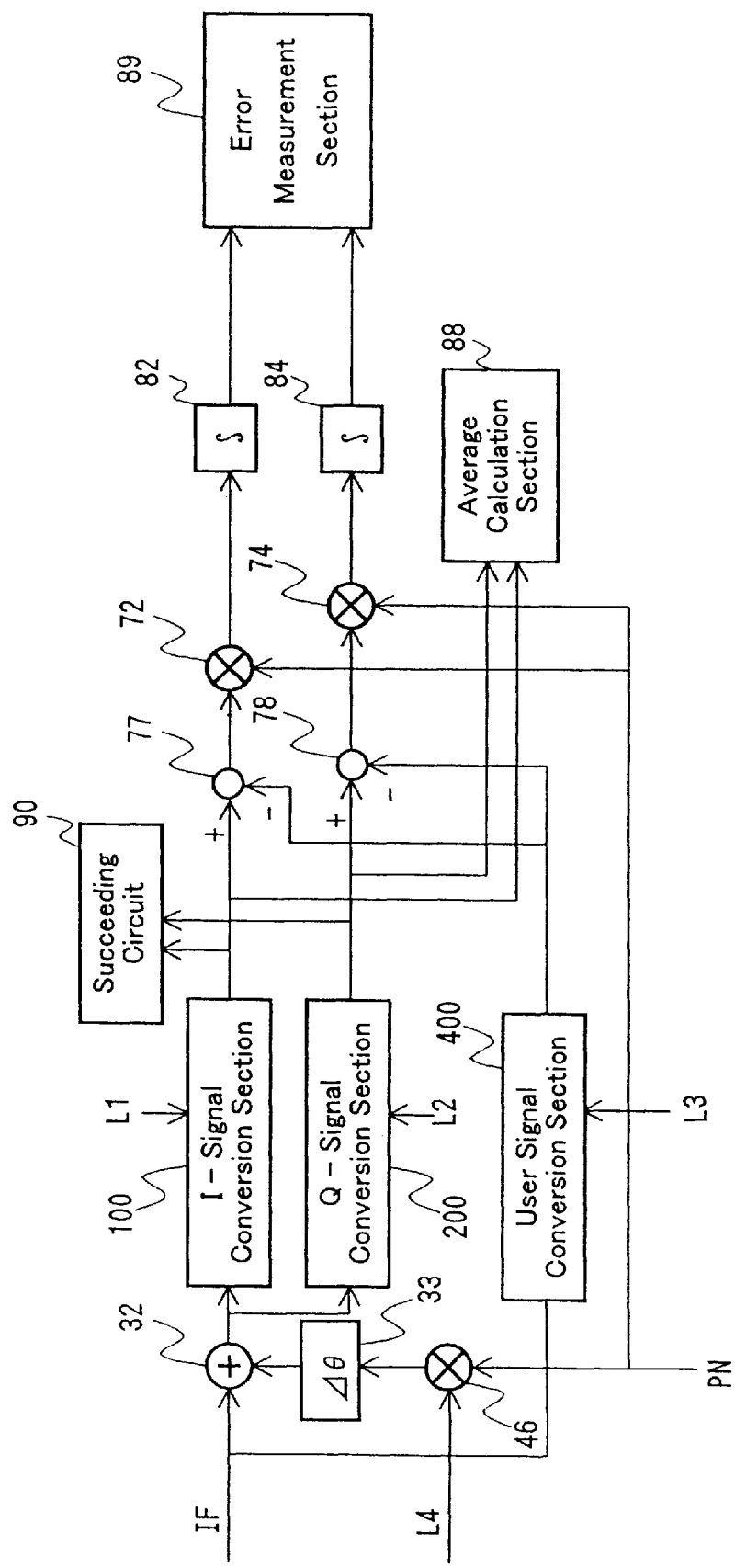
FIG. 23 is a block diagram showing the construction of a quadrature demodulator according to a seventh embodiment.

As shown in FIG. 23, a seventh embodiment is derived from the fifth embodiment and obtained by adding to the fifth embodiment a user signal conversion section 400, a subtractor 77 and a quadrature subtractor 78, which are the characteristic features of the third embodiment. As mentioned in the description of the fifth embodiment, only the P(t) term in an output of the I signal conversion section 100 (Q signal conversion section 200) is used. Hence, only the P(t) term in an output of the I signal conversion section (Q signal conversion section 200) may be applied from the subtractor 77 (quadrature subtractor 78) using the user signal conversion section 400, the subtractor 77, and the quadrature subtractor 78 as in the third embodiment. Additionally, the sections 100 and 200 can be calibrated with a high degree of accuracy due to the fact that no user signal component is supplied to a multiplier 72 (quadrature multiplier 74).

Figure 24:
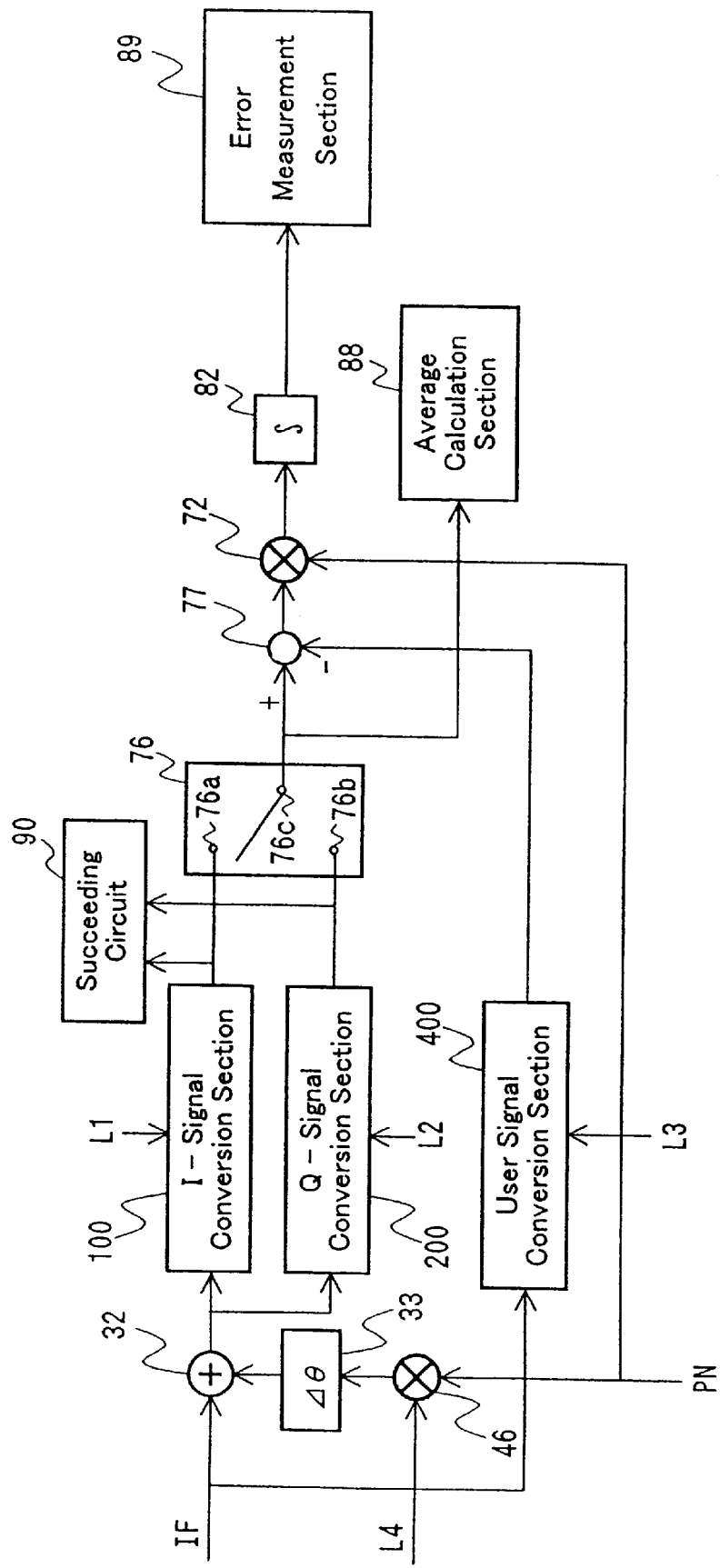
FIG. 24 is a diagram showing the construction including selector switch 76.

Note that the quadrature subtractor 78 may be incorporated into the subtractor 77, a quadrature multiplier 74 into the multiplier 72, and a quadrature integrator 84 into an integrator 82. The thus modified construction is shown in FIG. 24. That is, a selector switch 76 is provided so as to switch the connection of a terminal 76c on the subtractor 77 side between a terminal 76a on the I signal conversion section 100 side and a terminal 76b on the Q signal conversion section 200 side.

Eighth Embodiment

Figure 25:
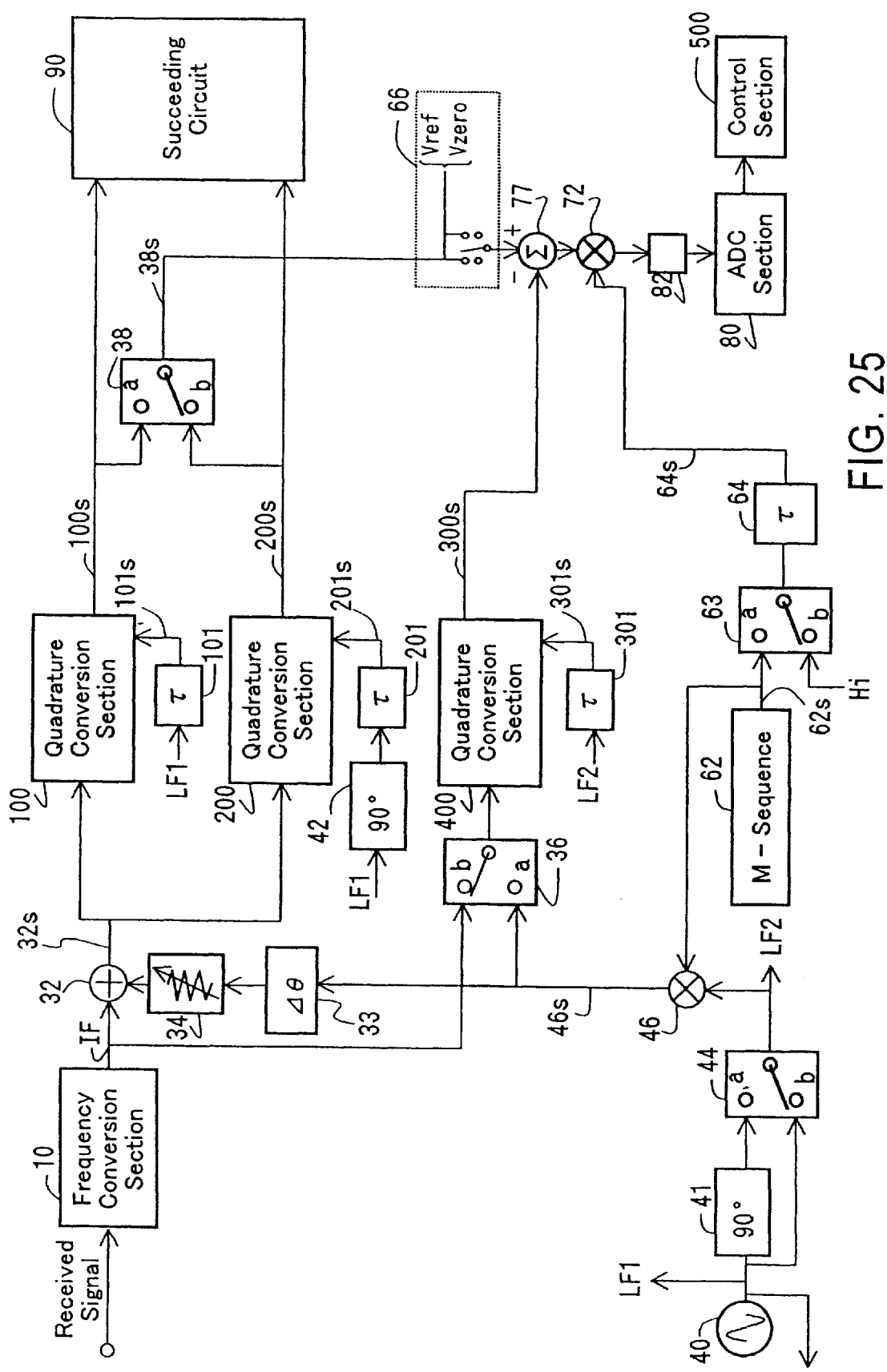
FIG. 25 is a block diagram showing the construction of a quadrature demodulator according to an eighth embodiment.
Figure 26:
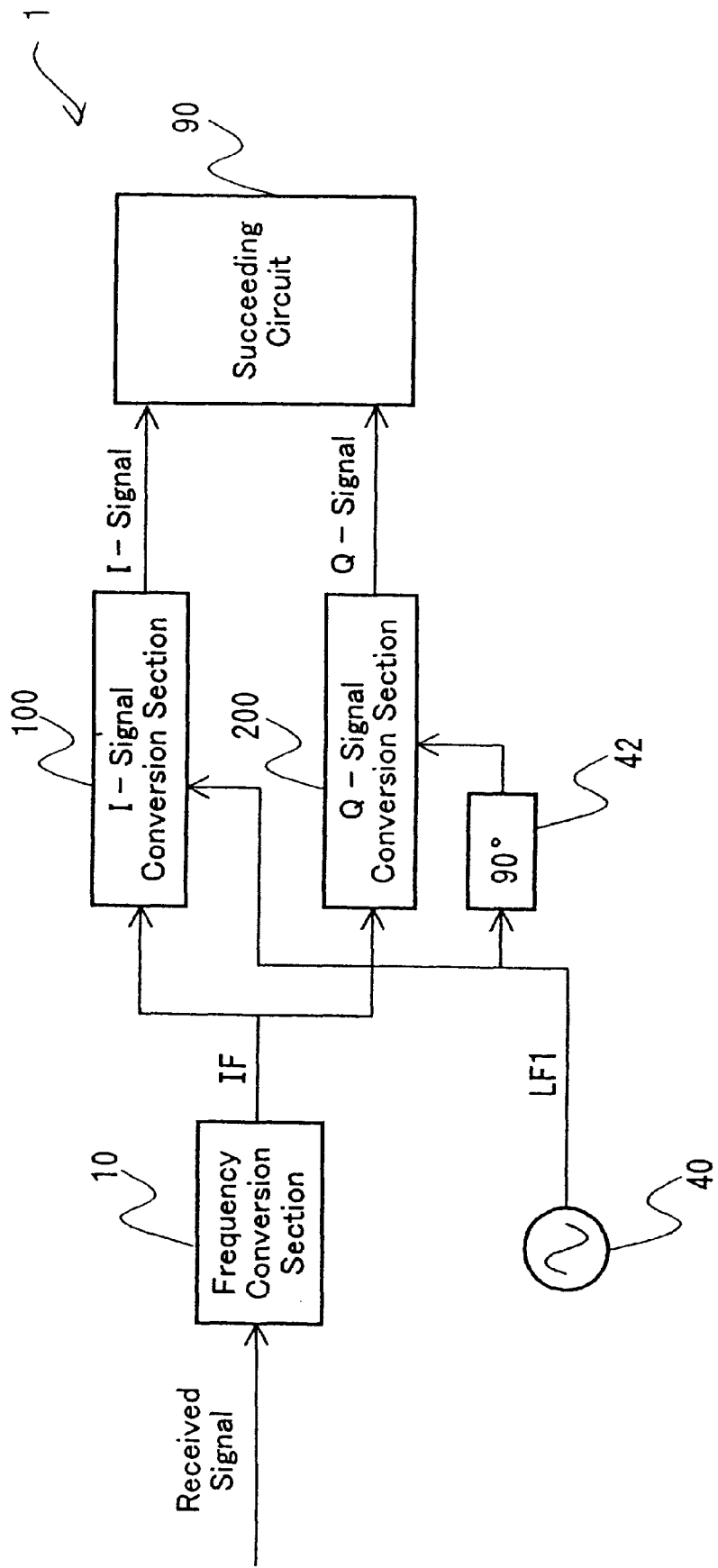
FIG. 26 is a diagram showing a specific example of a conventional quadrature demodulator 1.

An eighth embodiment is obtained by further materializing the construction of the seventh embodiment. FIG. 25 is a block diagram showing the construction of the eighth embodiment.

In response to a control signal from a control section 500, a selector switch 36 selects either an IF signal or a PN signal 46s and supplies the selected signal to a user signal conversion section 400.

A subtractor 77 subtracts a detected signal 300s, which is an output of the user signal conversion section 400, from a selected IQ signal 38s.

A multiplier 72 multiplies the output of the subtractor 77 with a delayed random pulse signal 64s to provide the multiplied output.

Note that the operation of the eighth embodiment is similar to those of the second and seventh embodiments.

According to the present invention, converted signals from the signal conversion sections can be processed in a desired way while phase, amplitude and DC offset errors, etc. of the signal conversion sections are being calibrated.

What is claimed is:

1. A quadrature demodulator comprising:
    an addition means for adding a user signal and a pseudo noise to generate a pseudo noise superimposed signal;
    a signal conversion means for mixing said pseudo noise superimposed signal with a local signal of a predetermined frequency to generate a converted signal;
    a first multiplication means for multiplying said converted signal with said pseudo noise to generate a correlated signal; and
    a first integration means for integrating said correlated signal to generate an output.

2. A quadrature demodulator according to claim 1, further comprising:
    a reference signal conversion means for mixing said pseudo noise superimposed signal with said local signal of a predetermined local frequency without amplitude and phase errors to generate a reference converted signal;
    a second multiplication means for multiplying said pseudo noise with said reference converted signal to generate a reference correlated signal; and
    a second integration means for integrating said reference correlated signal to provide an output.

3. A quadrature demodulator according to claim 2, further comprising:
    an amplitude error correction means for correcting an amplitude error of said signal conversion means; and
    an average calculation means for obtaining an average of said converted signals from said signal conversion means.

4. A quadrature demodulator according to claim 1, further comprising a phase error correction means for adjusting the phase of said local signal to be supplied to said signal conversion means so that said output of said first integration means equals a predetermined value.

5. A quadrature demodulator according to claim 2, further comprising amplitude error measurement means for obtaining an amplitude error on the basis of a value obtained by dividing a predetermined value, which is one of said outputs of said first integration means, by said output of said second integration means.

6. A quadrature demodulator according to claim 4, wherein said predetermined value is a maximum output value of said first integration means.

7. A quadrature demodulator according to claim 1, wherein said pseudo noise is smaller than said user signal.

8. A quadrature demodulator according to claim 7, wherein said pseudo noise is substantially equal to a floor noise.

9. A quadrature demodulator according to claim 1, further comprising:
    a quadrature signal conversion means for mixing a quadrature local signal with said pseudo noise superimposed signal to generate a quadrature converted signal, said quadrature local signal being obtained by shifting the phase of said local signal by 90 degrees;
    a quadrature multiplication means for multiplying said quadrature converted signal with said pseudo noise to generate a quadrature correlated signal; and
    a quadrature integration means for integrating said quadrature correlated signal to provide an output.

10. A quadrature demodulator according to claim 9, wherein
    said quadrature multiplication means is shared with said first multiplication means;
    said quadrature integration means is shared with said first integration means; and
    a connection switching means is provided so as to connect any one of said signal conversion means and said quadrature signal conversion means to said quadrature multiplication means.

11. A quadrature demodulator according to claim 1, further comprising a pseudo noise mixing means for mixing said pseudo noise with said local signal to supply an output thereof to said addition means.

12. A quadrature demodulator according to claim 1, further comprising:
    a user signal conversion means for mixing said user signal with said local signal of a predetermined local frequency to generate a converted user signal; and
    a subtraction means for subtracting said converted user signal from said converted signal to supply an output thereof to said first multiplication means; wherein
    said first multiplication means multiplies said output of said subtraction means with said pseudo noise to generate a correlated signal.

13. A quadrature demodulator according to claim 12, further comprising amplitude error measurement means for obtaining an amplitude error on the basis of a value obtained by dividing a predetermined value, which is one of said outputs of said first integration means, by a predicted output of said first integration means obtained if no amplitude and phase errors are supposed to exist.

14. A quadrature demodulator according to claim 13, wherein said predetermined value is a maximum output value of said first integration means.

15. A quadrature demodulator according to claim 13, further comprising:
    an amplitude error correction means for correcting an amplitude error of said signal conversion means; and
    an average calculation means for obtaining an average of said converted signals from said signal conversion means.

16. A quadrature demodulator according to claim 12, further comprising a phase error correction means for adjusting the phase of said local signal to be supplied to said signal conversion means so that said output of said first integration means becomes maximum.

17. A quadrature demodulator according to claim 12, wherein said pseudo noise is smaller than said user signal.

18. A quadrature demodulator according to claim 17, wherein said pseudo noise is substantially equal to a floor noise.

19. A quadrature demodulator according to claim 12, further comprising:
- a quadrature signal conversion means for mixing a quadrature local signal with said pseudo noise superimposed signal to generate a quadrature converted signal, said quadrature local signal being obtained by shifting the phase of said local signal by 90 degrees;
- a quadrature subtraction means for subtracting said converted user signal from said quadrature converted signal;
- a quadrature multiplication means for multiplying an output of said quadrature subtraction means with said pseudo noise to generate a quadrature correlated signal; and
- a quadrature integration means for integrating said quadrature correlated signal to generate an output.

20. A quadrature demodulator according to claim 19, wherein
said quadrature multiplication means is shared with said first multiplication means;
said quadrature integration means is shared with said first integration means; and
connection switching means is provided so as to connect any one of said signal conversion means and said quadrature signal conversion means to said quadrature multiplication means.

21. A quadrature demodulator according to claim 12, further comprising pseudo noise mixing means for mixing said pseudo noise with said local signal to supply an output thereof to said addition means.

22. A quadrature demodulator comprising:
- a phase shift means for changing the phase of a pseudo noise to provide an output;
- an addition means for adding a user signal and said output of said phase shift means to generate a pseudo noise superimposed signal;
- a signal conversion means for mixing said pseudo noise superimposed signal with a local signal of a predetermined local frequency to generate a converted signal;
- a quadrature signal conversion means for mixing a quadrature local signal with said pseudo noise superimposed signal to generate a quadrature converted signal, said quadrature local signal being obtained by shifting the phase of said local signal by 90 degrees;
- a multiplication means for multiplying said pseudo noise with said converted signal to generate a correlated signal;
- a quadrature multiplication means for multiplying said pseudo noise with said quadrature converted signal to generate a quadrature correlated signal;
- an integration means for integrating said correlated signal to provide an output; and
- a quadrature integration means for integrating said quadrature correlated signal to provide an output.

23. A quadrature demodulator according to claim 22, further comprising an error measurement means for measuring a DC offset error, a phase error, and an amplitude error on the basis of said outputs of the integration means and said quadrature integration means.

24. A quadrature demodulator according to claim 23, wherein said error measurement means neglects at least one of said DC offset error, said phase error, and said amplitude error and measures an unneglected error.

25. A quadrature demodulator according to claim 22, wherein said pseudo noise is smaller than said user signal.

26. A quadrature demodulator according to claim 25, wherein said pseudo noise is substantially equal to a floor noise.

27. A quadrature demodulator according to claim 22, further comprising a pseudo noise mixing means for mixing said pseudo noise with said local signal to supply an output thereof to said phase shift means.

28. A quadrature demodulator according to claim 22, wherein
said quadrature multiplication means is shared with said multiplication means;
said quadrature integration means is shared with said integration means; and
connection switching means is provided so as to connect any one of said signal conversion means and said quadrature signal conversion means to said quadrature multiplication means.

29. A quadrature demodulator according to claim 22, further comprising:
- a user signal conversion means for mixing said user signal with said local signal of a predetermined local frequency to generate a converted user signal;
- a subtraction means for subtracting said converted user signal from said converted signal to supply an output thereof to said multiplication means;
- a quadrature subtraction means for subtracting said converted user signal from said quadrature converted signal to supply an output thereof to said quadrature multiplication means; wherein
said multiplication means generates a correlated signal obtained by multiplying said output of said subtraction means with said pseudo noise, and
said quadrature multiplication means generates a quadrature correlated signal obtained by multiplying said output of said quadrature subtraction means with said pseudo noise.

30. A quadrature demodulation method comprising:
- an addition step for adding a user signal and a pseudo noise to generate a pseudo noise superimposed signal;
- a signal conversion step for mixing said pseudo noise superimposed signal with a local signal of a predetermined frequency to generate a converted signal;
- a first multiplication step for multiplying said converted signal with said pseudo noise to generate a correlated signal; and
- a first integration step for integrating said correlated signal to generate an output.

31. A quadrature demodulation method according to claim 30, further comprising:
- a reference signal conversion step for mixing said pseudo noise superimposed signal with said local signal of a predetermined local frequency without amplitude and phase errors to generate a reference converted signal;
- a second multiplication step for multiplying said pseudo noise with said reference converted signal to generate a reference correlated signal;
- a second integration step for integrating said reference correlated signal to provide an output;
- an amplitude error correction step for correcting an amplitude error of said signal conversion step; and
- an average calculation step for obtaining an average of said converted signals from said signal conversion step.

32. A quadrature demodulation method comprising:
- a phase shift step for changing the phase of a pseudo noise to provide an output;
- an addition step for adding a user signal and said output of said phase shift step to generate a pseudo noise superimposed signal;
- a signal conversion step for mixing said pseudo noise superimposed signal with a local signal of a predetermined local frequency to generate a converted signal;

a quadrature signal conversion step for mixing a quadrature local signal with said pseudo noise superimposed signal to generate a quadrature converted signal, said quadrature local signal being obtained by shifting the phase of said local signal by 90 degrees;

a multiplication step for multiplying said pseudo noise with said converted signal to generate a correlated signal;

a quadrature multiplication step for multiplying said pseudo noise with said quadrature converted signal to generate a quadrature correlated signal;

an integration step for integrating said correlated signal to provide an output; and a quadrature integration step for integrating said quadrature correlated signal to provide an output.

33. A quadrature demodulation method according to claim 32, further comprising the steps of:

providing an I axis and a Q axis, said axes being in quadrature with each other;

assigning an output of said integration step to one of said I axis and said Q axis, and assigning an output of said quadrature integration step to the other one of said I axis and said Q axis;

depicting an ellipse passing through coordinates defined by said I axis and said Q axis; and obtaining a DC offset error, a phase error, and an amplitude error from said ellipse.

34. A computer-readable medium embodying a program of instructions for execution by the computer to perform a quadrature demodulation method comprising:

an addition step for adding a user signal and a pseudo noise to generate a pseudo noise superimposed signal;

a signal conversion step for mixing said pseudo noise superimposed signal with a local signal of a predetermined frequency to generate a converted signal;

a first multiplication step for multiplying said converted signal with said pseudo noise to generate a correlated signal; and a first integration step for integrating said correlated signal to generate an output.

35. A computer-readable medium according to claim 34, wherein the quadrature demodulation method further comprises:

a reference signal conversion step for mixing said pseudo noise superimposed signal with said local signal of a predetermined local frequency without amplitude and phase errors to generate a reference converted signal;

a second multiplication step for multiplying said pseudo noise with said reference converted signal to generate a reference correlated signal;

a second integration step for integrating said reference correlated signal to provide an output;

an amplitude error correction step for correcting an amplitude error of said signal conversion step; and an average calculation step for obtaining an average of said converted signals from said signal conversion step.

36. A computer-readable medium embodying a program of instructions for execution by the computer to perform a quadrature demodulation method comprising:

a phase shift step for changing the phase of a pseudo noise to provide an output;

an addition step for adding a user signal and said output of said phase shift step to generate a pseudo noise superimposed signal;

a signal conversion step for mixing said pseudo noise superimposed signal with a local signal of a predetermined local frequency to generate a converted signal;

a quadrature signal conversion step for mixing a quadrature local signal with said pseudo noise superimposed signal to generate a quadrature converted signal, said quadrature local signal being obtained by shifting the phase of said local signal by 90 degrees;

a multiplication step for multiplying said pseudo noise with said converted signal to generate a correlated signal;

a quadrature multiplication step for multiplying said pseudo noise with said quadrature converted signal to generate a quadrature correlated signal;

an integration step for integrating said correlated signal to provide an output; and a quadrature integration step for integrating said quadrature correlated signal to provide an output.

37. A computer-readable medium according to claim 36, the quadrature demodulation method further comprising the steps of:

providing an I axis and a Q axis, said axes being in quadrature with each other;

assigning an output of said integration step to one of said I axis and said Q axis, and assigning an output of said quadrature integration step to the other one of said I axis and said Q axis;

depicting an ellipse passing through coordinates defined by said I axis and said Q axis; and obtaining a DC offset error, a phase error, and an amplitude error from said ellipse.

38. A quadrature demodulator comprising:

an addition device that adds a user signal and a pseudo noise to generate a pseudo noise superimposed signal;

a signal conversion device that mixes said pseudo noise superimposed signal with a local signal of a predetermined frequency to generate a converted signal;

a first multiplication device that multiplies said converted signal with said pseudo noise to generate a correlated signal; and a first integration device that integrates said correlated signal to generate an output.

39. A quadrature demodulator comprising:

a phase shift device that changes the phase of a pseudo noise to provide an output;

an addition device that adds a user signal and said output of said phase shift device to generate a pseudo noise superimposed signal;

a signal conversion device that mixes said pseudo noise superimposed signal with a local signal of a predetermined local frequency to generate a converted signal;

a quadrature signal conversion device that mixes a quadrature local signal with said pseudo noise superimposed signal to generate a quadrature converted signal, said quadrature local signal being obtained by shifting the phase of said local signal by 90 degrees;

a multiplication device that multiplies said pseudo noise with said converted signal to generate a correlated signal;

a quadrature multiplication device that multiplies said pseudo noise with said quadrature converted signal to generate a quadrature correlated signal;

an integration device that integrates said correlated signal to provide an output; and a quadrature integration device that integrates said quadrature correlated signal to provide an output.

* * * * *